(12) United States Patent
Okabe et al.

(10) Patent No.: US 10,690,975 B2
(45) Date of Patent: Jun. 23, 2020

(54) ACTIVE MATRIX SUBSTRATE, MANUFACTURING METHOD THEREFOR AND DISPLAY DEVICE

(71) Applicant: Sharp Kabushiki Kaisha, Sakai, Osaka (JP)

(72) Inventors: Tohru Okabe, Sakai (JP); Hirohiko Nishiki, Sakai (JP); Shinji Nakajima, Sakai (JP); Izumi Ishida, Sakai (JP); Shogo Murashige, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 47 days.

(21) Appl. No.: 16/088,851

(22) PCT Filed: Mar. 24, 2017

(86) PCT No.: PCT/JP2017/011997
§ 371 (c)(1),
(2) Date: Sep. 27, 2018

(87) PCT Pub. No.: WO2017/170219
PCT Pub. Date: Oct. 5, 2017

(65) Prior Publication Data
US 2019/0113813 A1   Apr. 18, 2019

(30) Foreign Application Priority Data
Mar. 31, 2016 (JP) ................. 2016-070802

(51) Int. Cl.
*G02F 1/1362* (2006.01)
*H01L 29/786* (2006.01)
(Continued)

(52) U.S. Cl.
CPC ...... *G02F 1/136204* (2013.01); *G02F 1/1365* (2013.01); *G02F 1/136227* (2013.01);
(Continued)

(58) Field of Classification Search
None
See application file for complete search history.

(56) References Cited

U.S. PATENT DOCUMENTS

2002/0101547 A1   8/2002   Lee et al.
2004/0017531 A1   1/2004   Nagata et al.
(Continued)

FOREIGN PATENT DOCUMENTS

JP   11-194368 A   7/1999
JP   11-338376 A   12/1999
(Continued)

OTHER PUBLICATIONS

Official Communication issued in International Patent Application No. PCT/JP2017/011997, dated Jun. 20, 2017.

*Primary Examiner* — Anthony Ho
*Assistant Examiner* — Kevin Quinto
(74) *Attorney, Agent, or Firm* — Keating & Bennett, LLP

(57) ABSTRACT

Provided are an active-matrix substrate, a method for manufacturing the same, and a display device, which render it possible to inhibit electrostatic discharge from occurring during the process of manufacturing a display panel and suppress manufacturing cost. An IGZO film, which is positioned between a silicon oxide film included in a gate insulating film and an etch-stop layer, is annealed at 200 to 350° C. after a passivation film for protecting a TFT is formed. As a result, the passivation film is annealed, and the IGZO film is changed from a conductor to a semiconductor. Consequently, it is not only possible to suppress the occurrence of ESD, but also possible to eliminate the need to sever an electrostatic discharge prevention circuit from a display panel, resulting in a reduced cost of manufacturing a display device.

19 Claims, 25 Drawing Sheets

(51) Int. Cl.
*H01L 21/02* (2006.01)
*H01L 27/12* (2006.01)
*G02F 1/1365* (2006.01)
*H01L 29/423* (2006.01)
*H01L 29/49* (2006.01)
*H01L 29/51* (2006.01)
*G02F 1/13* (2006.01)
*H01L 27/02* (2006.01)

(52) U.S. Cl.
CPC .... *H01L 21/0217* (2013.01); *H01L 21/02164* (2013.01); *H01L 21/02274* (2013.01); *H01L 21/02554* (2013.01); *H01L 21/02565* (2013.01); *H01L 21/02664* (2013.01); *H01L 27/1225* (2013.01); *H01L 27/1244* (2013.01); *H01L 27/1248* (2013.01); *H01L 29/42356* (2013.01); *H01L 29/4908* (2013.01); *H01L 29/518* (2013.01); *H01L 29/7869* (2013.01); *H01L 29/78696* (2013.01); *G02F 1/1309* (2013.01); *H01L 27/0251* (2013.01)

(56) References Cited

U.S. PATENT DOCUMENTS

| | | | |
|---|---|---|---|
| 2009/0020759 A1* | 1/2009 | Yamazaki | H01L 27/12 257/59 |
| 2011/0115839 A1 | 5/2011 | Takahashi et al. | |
| 2012/0138922 A1 | 6/2012 | Yamazaki et al. | |
| 2013/0320334 A1 | 12/2013 | Yamazaki et al. | |
| 2014/0027769 A1* | 1/2014 | Hara | H01L 29/7869 257/43 |
| 2014/0286076 A1 | 9/2014 | Aoki et al. | |

FOREIGN PATENT DOCUMENTS

| | | |
|---|---|---|
| JP | 2009-130273 A | 6/2009 |
| JP | 2011-141529 A | 7/2011 |
| JP | 2012-134475 A | 7/2012 |
| JP | 2014-7399 A | 1/2014 |
| JP | 2014-209727 A | 11/2014 |
| WO | 2012/137711 A1 | 10/2012 |

* cited by examiner

FIG. 2
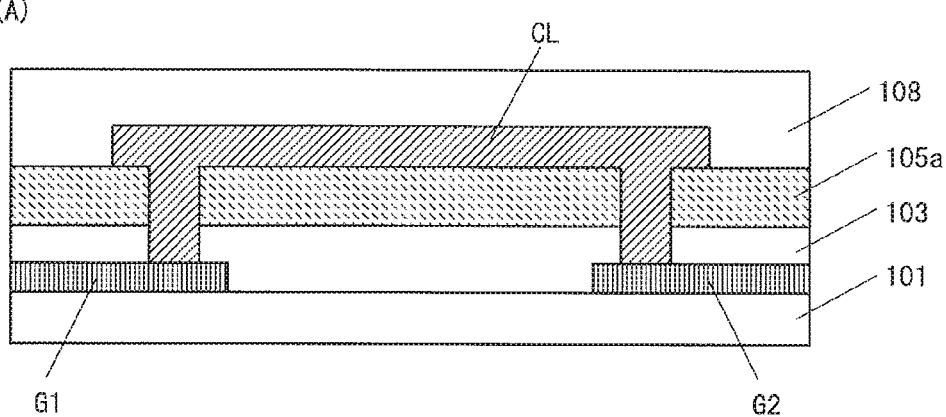
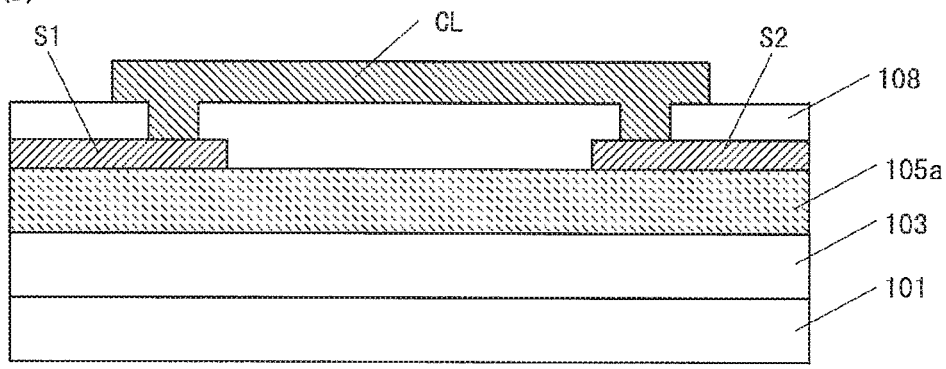
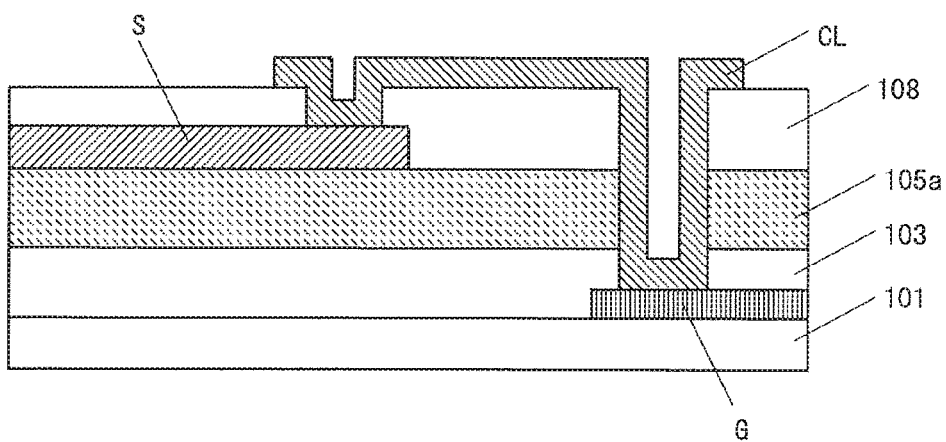

FIG. 9
(A)
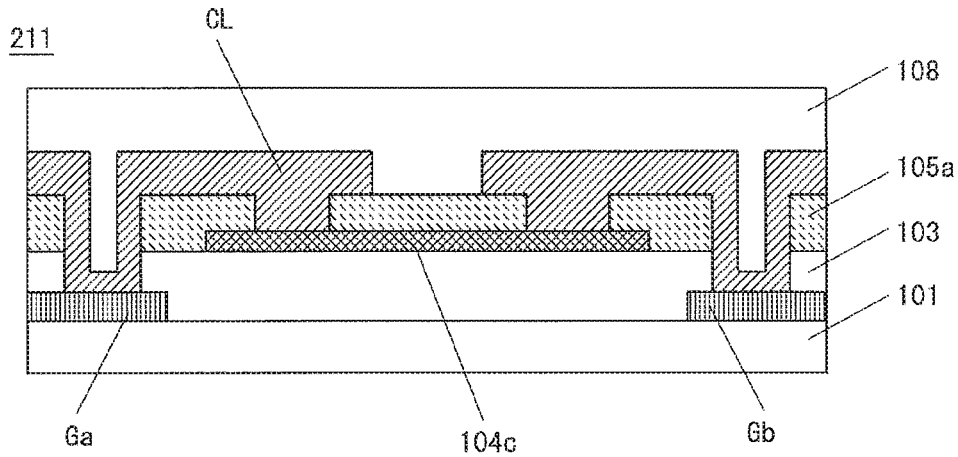
(B)
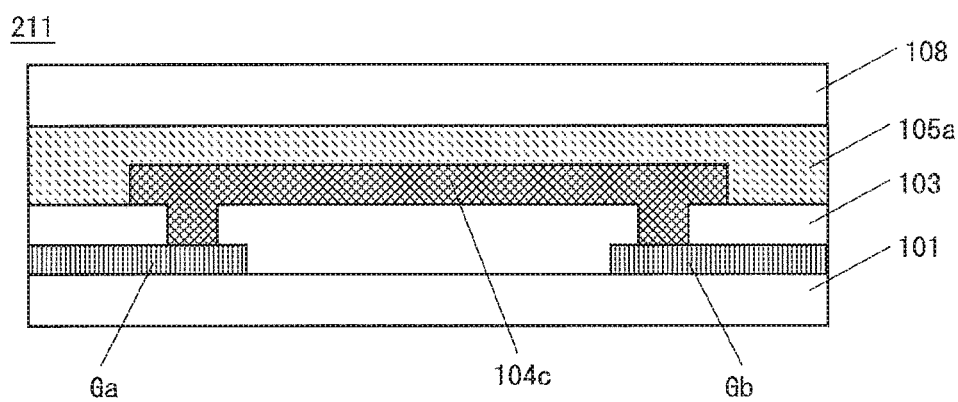
(C)
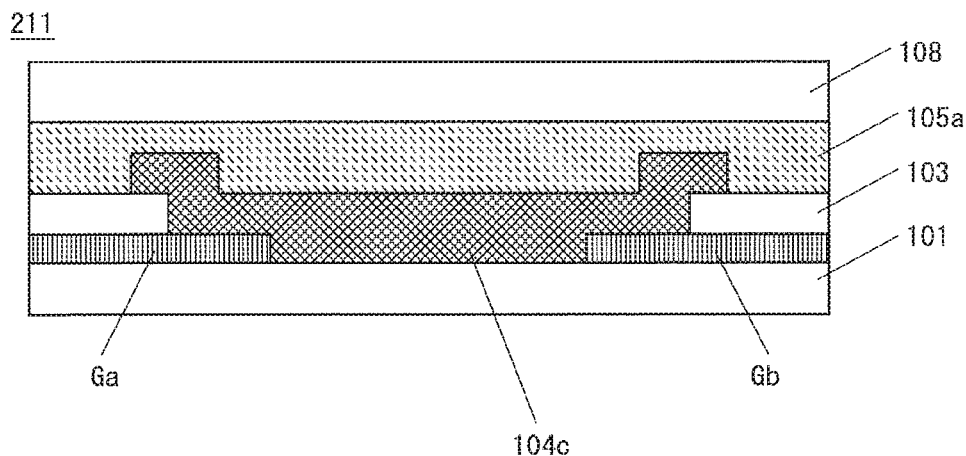

FIG. 11
(A)
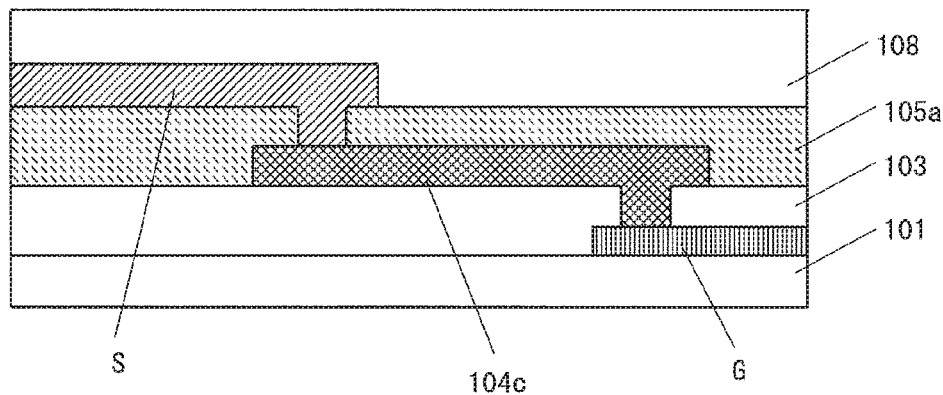
(B)
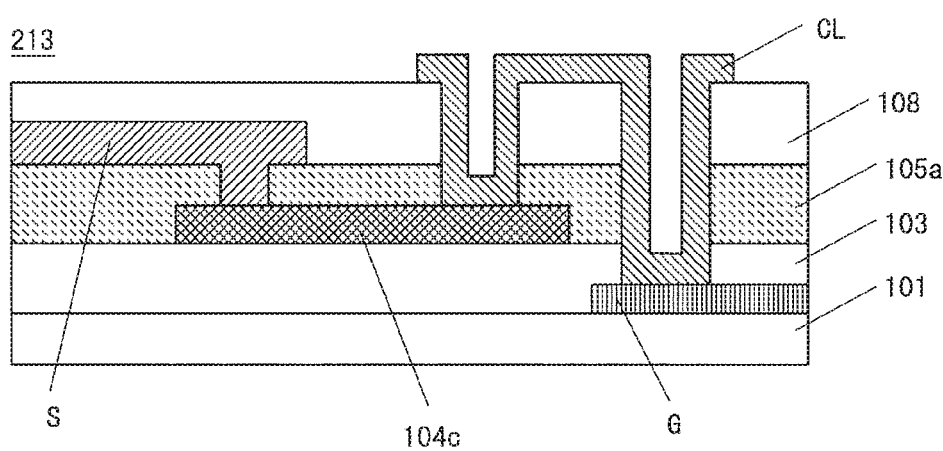

FIG. 12
(A)
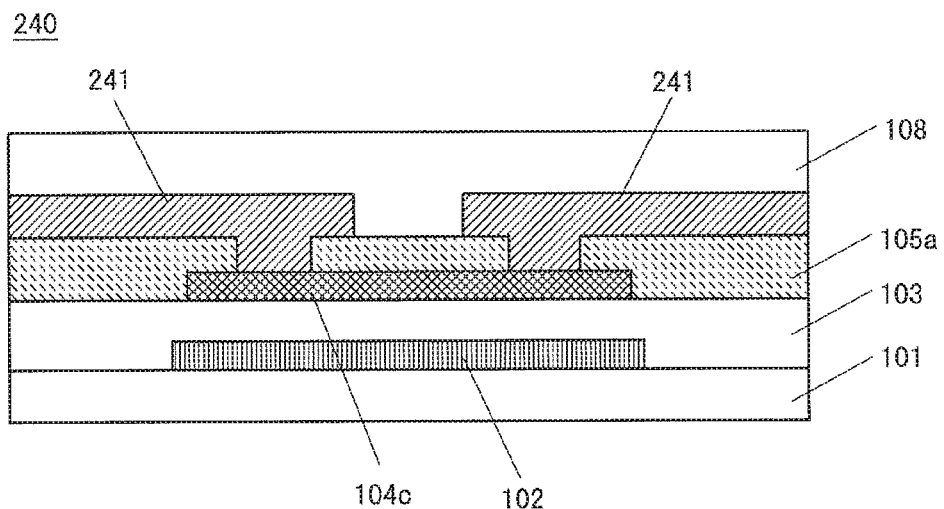
(B)
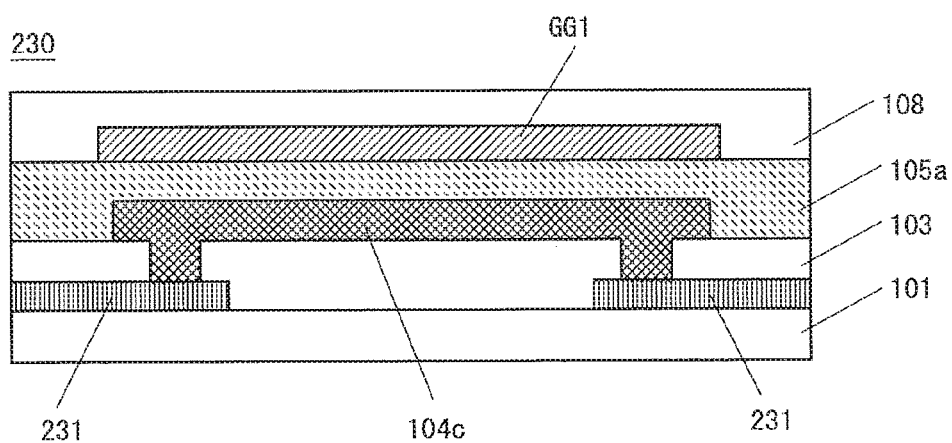

FIG. 13
(A)
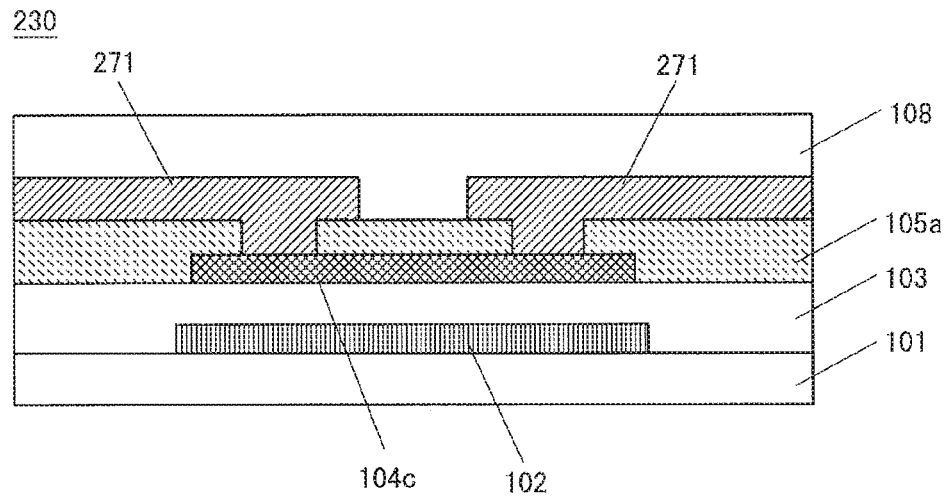
(B)
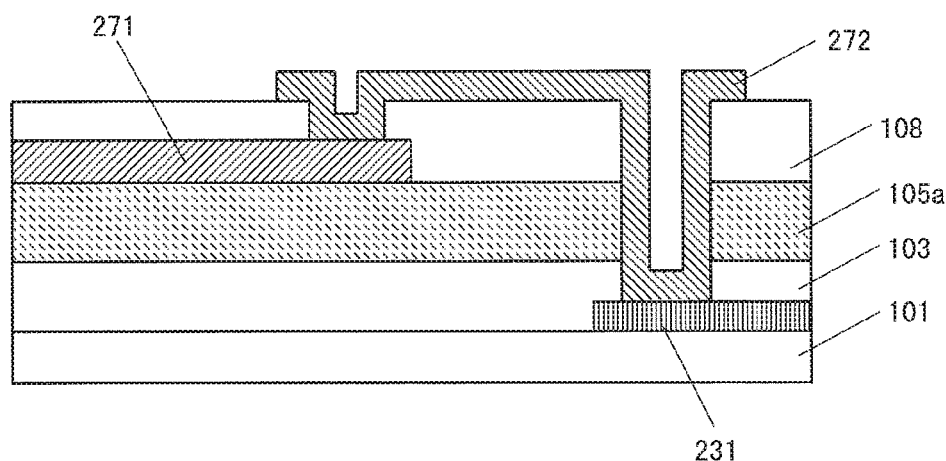
(C)
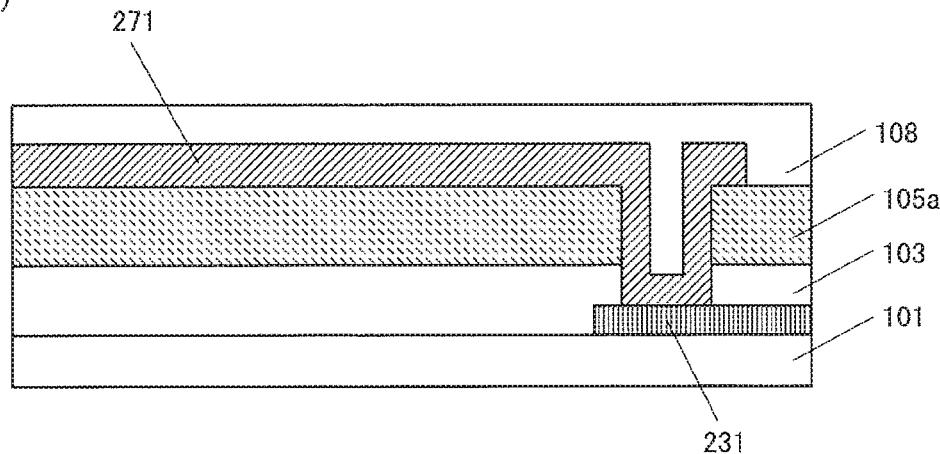

FIG. 22
(A)
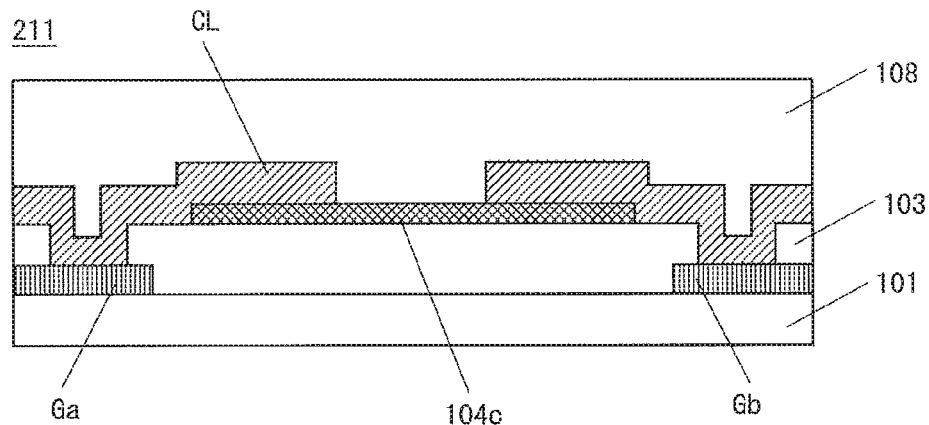
(B)
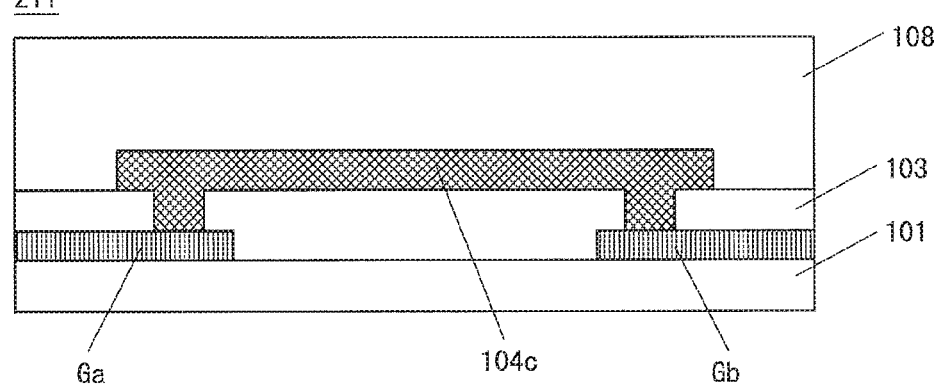
(C)
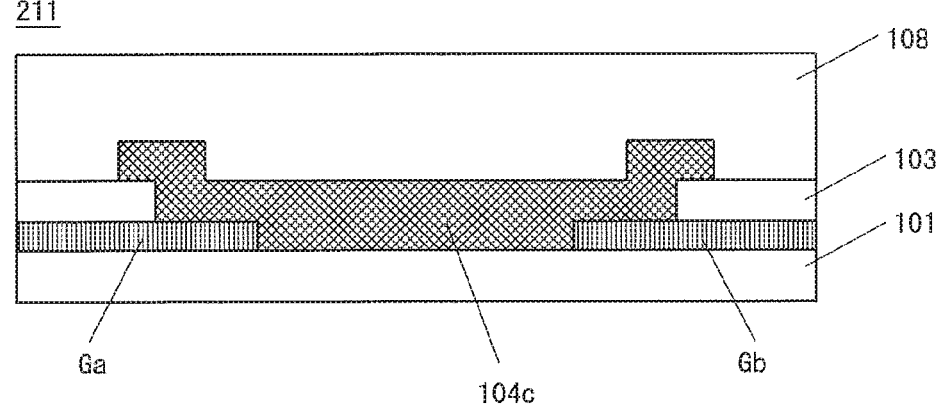

FIG. 24
(A)
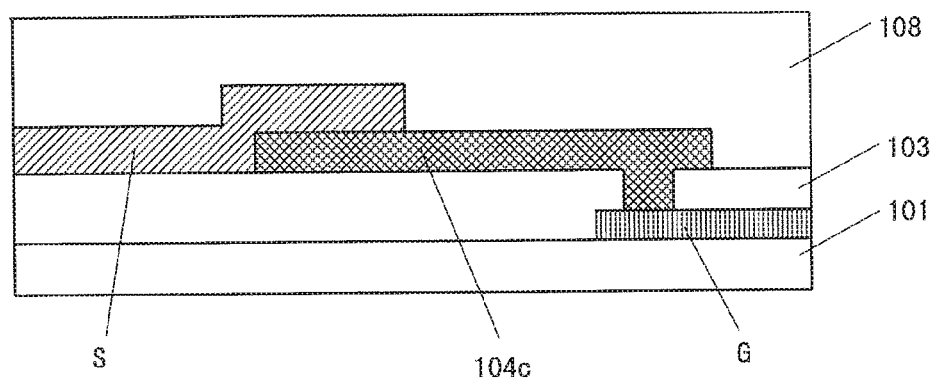
(B)
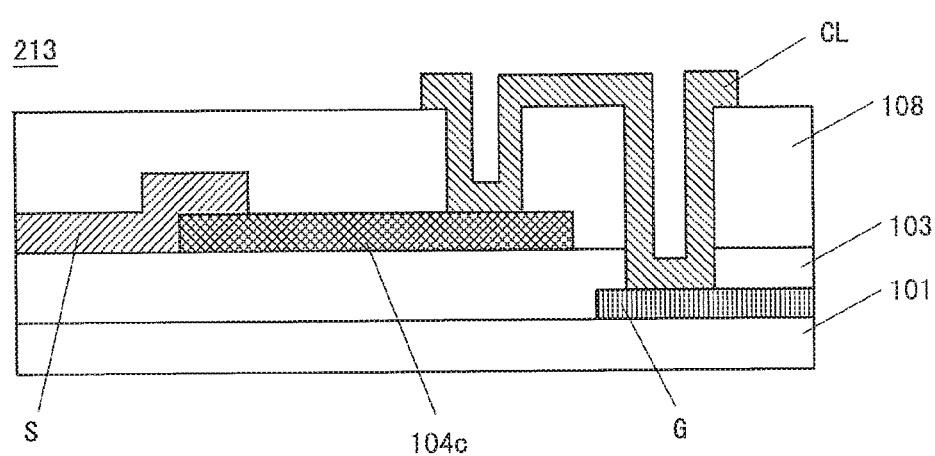

FIG. 25
(A)
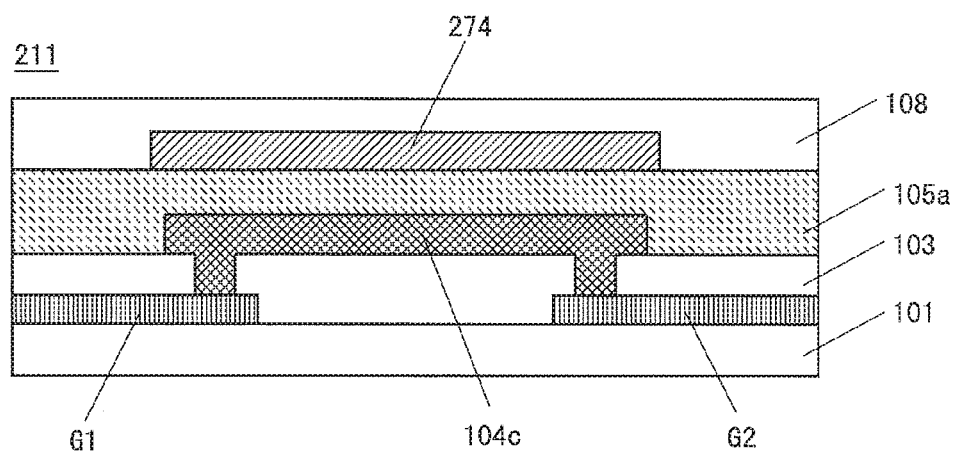
(B)
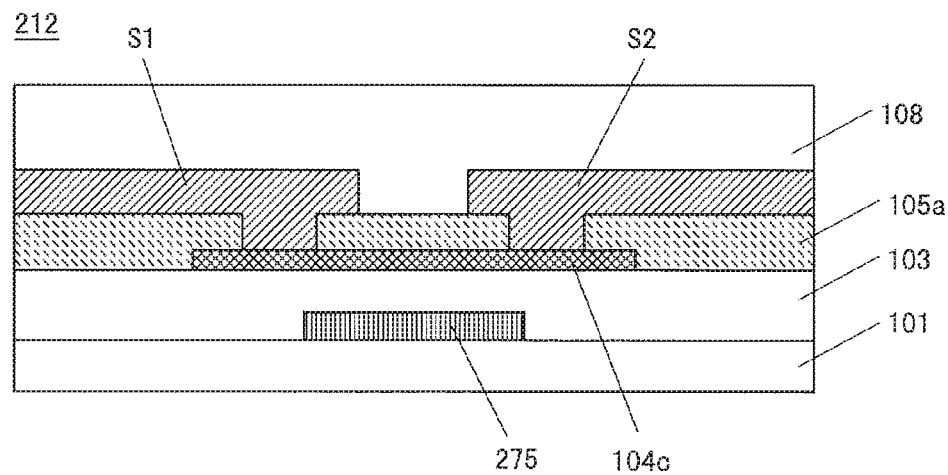

ACTIVE MATRIX SUBSTRATE, MANUFACTURING METHOD THEREFOR AND DISPLAY DEVICE

TECHNICAL FIELD

The present invention relates to active-matrix substrates, methods for manufacturing the same, and display devices, particularly to an active-matrix substrate, a method for manufacturing the same, and a display device, which render it possible to inhibit electrostatic discharge.

BACKGROUND ART

The manufacturing process for forming a display panel (e.g., a liquid crystal panel) on an insulating substrate such as a glass substrate includes steps prone to generating static electricity, e.g., plasma caused by dry etching or static electricity caused by an air knife for use in removing an etchant used for wet etching. The generated static electricity charges some scanning signal lines and data signal lines, with the result that a high voltage is applied between signal lines that are insulated from each other, and when the voltage exceeds a dielectric strength of an insulating film, electrostatic discharge (ESD) occurs. When the ESD occurs, the insulating film, which insulates adjacent conductors, is broken, whereby a short circuit occurs between signal lines that are to be insulated, with the result that the liquid crystal panel is caused to operate abnormally or misoperate.

Therefore, an electromagnetic wave detection device described in Patent Document 1 includes a protection circuit provided outside a detection portion having photoelectric conversion elements formed therein, and the protection circuit includes input/output terminals formed on scanning signal lines and data signal lines, conductor lines extending outwardly from the input/output terminals, and a common line coupling the conductor lines outside the input/output terminals. This prevents variations in operating voltage among thin-film transistors and physical breakage of the thin-film transistors, even if the scanning signal lines and the data signal lines are electrostatically charged.

CITATION LIST

Patent Document

Patent Document 1: Japanese Laid-Open Patent Publication No. 2009-130273

SUMMARY OF THE INVENTION

Problems to be Solved by the Invention

In the case where the common line coupling the conductor lines is provided outside the input terminals, as in Patent Document 1, it is necessary to set the step of severing the glass substrate on which the common line is formed, after completion of steps in which electrostatic charge is likely to occur but before testing the electromagnetic wave detection device. However, some cost is generated for the step of severing the glass substrate, resulting in an increase in the cost of manufacturing the electromagnetic wave detection device.

Therefore, an objective of the present invention is to provide an active-matrix substrate, a method for manufacturing the same, and a display device, which render it possible to inhibit electrostatic discharge from occurring during the process of manufacturing a display panel and suppress the cost of manufacturing.

Solution to the Problems

A first aspect of the present invention is directed to an active-matrix substrate with a plurality of pixel forming portions formed in a matrix on an insulating substrate, including:
a display portion including a plurality of scanning signal lines formed on the insulating substrate, a plurality of data signal lines formed on a gate insulating film so as to cross each of the scanning signal lines, the gate insulating film being formed on the scanning signal lines, and the pixel forming portions being formed corresponding to respective intersections of the scanning signal lines and the data signal lines;
a scanning signal line driver circuit configured to sequentially select the scanning signal lines;
a data signal line driver circuit configured to write image signal voltages to the data signal lines, the image signal voltages being generated on the basis of externally inputted image data; and
a coupling conductor line provided outside the display portion and coupling either the scanning signal lines or the data signal lines, or both, wherein,
the coupling conductor line couples the signal lines by coupling lines disposed between each respective adjacent pair of the signal lines and including oxide semiconductor films.

In a second aspect of the present invention, based on the first aspect of the present invention, wherein at least some of the coupling lines that connect each respective adjacent pair of the signal lines are connected simply by the oxide semiconductor films.

In a third aspect of the present invention, based on the second aspect of the present invention, wherein the oxide semiconductor films included in the coupling lines that connect each respective adjacent pair of the signal lines are semiconductive.

In a fourth aspect of the present invention, based on the first aspect of the present invention, wherein the coupling conductor line includes a first coupling conductor line and a second coupling conductor line, the first coupling conductor line couples the scanning signal lines by first coupling lines disposed between each respective adjacent pair of the scanning signal lines and including the oxide semiconductor films, and the second coupling conductor line couples the data signal lines by second coupling lines disposed between each respective adjacent pair of the data signal lines and including the oxide semiconductor films.

In a fifth aspect of the present invention, based on the first aspect of the present invention, wherein the coupling conductor line couples the scanning signal lines and the data signal lines by disposing the coupling lines including the oxide semiconductor films between each respective adjacent pair of the scanning signal lines, between each respective adjacent pair of the data signal lines, and between an adjacent pair of the scanning signal line and the data signal line.

In a sixth aspect of the present invention, based on the first aspect of the present invention, further including a display portion inspection circuit configured to inspect whether there is any short circuit between the scanning signal lines, between the data signal lines, and between the scanning signal lines and the data signal lines, the display portion inspection circuit being disposed outside the display portion, wherein, the display portion inspection circuit includes:

a first inspection control portion including a plurality of first lines respectively connected to the scanning signal lines and a plurality of first thin-film transistors respectively connected to the first lines and controlling voltages applied to the scanning signal lines, the first inspection control portion connecting the first lines together or separately for each of two or more groups; and a second inspection control portion including a plurality of second lines respectively connected to the data signal lines and a plurality of second thin-film transistors respectively connected to the second lines and controlling voltages applied to the data signal lines, the second inspection control portion connecting the second lines together or separately for each of two or more groups, wherein, the first and second thin-film transistors have channel layers made of an oxide semiconductor.

In a seventh aspect of the present invention, based on the first aspect of the present invention, wherein the pixel forming portion includes a thin-film transistor with a channel layer made of an oxide semiconductor, and the thin-film transistor is of a channel-etched type.

In an eighth aspect of the present invention, based on the first aspect of the present invention, wherein the pixel forming portion includes a thin-film transistor with a channel layer made of an oxide semiconductor, and the thin-film transistor is of a channel-stop type.

In a ninth aspect of the present invention, based on the seventh or the eighth aspects of the present invention, wherein the coupling lines that couple each respective adjacent pair of the scanning signal lines are structured such that the respective adjacent pair of the scanning signal lines are directly connected by the oxide semiconductor film.

In a tenth aspect of the present invention, based on the seventh or the eighth aspects of the present invention, wherein the coupling lines that couple each respective adjacent pair of the scanning signal lines are structured such that the oxide semiconductor film and the respective adjacent pair of the scanning signal lines are connected by a connection line formed simultaneously with the data signal lines.

In an eleventh aspect of the present invention, based on the seventh or the eighth aspects of the present invention, wherein the coupling lines that couple each respective adjacent pair of the data signal lines are structured such that the respective adjacent pair of the data signal lines are directly connected to the oxide semiconductor film.

In a twelfth aspect of the present invention, based on the seventh or the eighth aspects of the present invention, wherein the coupling line that couples the adjacent pair of the scanning signal line and the data signal line is structured such that the data signal line and the scanning signal line are directly connected to the oxide semiconductor film.

In a thirteenth aspect of the present invention, based on the seventh or the eighth aspects of the present invention, wherein the coupling line that couples the adjacent pair of the scanning signal line and the data signal line is structured such that one of the data signal line and the scanning signal line is directly connected to the oxide semiconductor film, and the other is connected to the oxide semiconductor film via a connection line formed simultaneously with pixel electrodes provided in the pixel forming portions.

In a fourteenth aspect of the present invention, based on the thirteenth aspect of the present invention, wherein all of the data signal line, the scanning signal line, and the oxide semiconductor film do not simultaneously overlap one another.

A fifteenth aspect of the present invention is directed to a display device using an active-matrix substrate of the first aspect of the present invention as a display panel for displaying an image.

A sixteenth aspect of the present invention is directed to a method for manufacturing an active-matrix substrate of the first aspect of the present invention, including the steps of:

forming a gate insulating film so as to cover a gate electrode formed on the insulating substrate;

forming the oxide semiconductor film on the gate insulating film;

performing a conductivity induction treatment for rendering the oxide semiconductor film conductive;

covering the oxide semiconductor film with an oxide film; and performing a semiconductivity induction heat treatment for changing the oxide semiconductor film from a conductor to a semiconductor, wherein, the semiconductivity induction heat treatment is a heat treatment performed during procedures from forming a protective film for protecting the pixel forming portion to forming an orientation film for aligning an orientation direction of liquid crystal molecules.

In a seventeenth aspect of the present invention, based on the sixteenth aspect of the present invention, wherein the semiconductivity induction heat treatment is a heat treatment performed after the protective film for protecting the pixel forming portion is formed.

In an eighteenth aspect of the present invention, based on the sixteenth aspect of the present invention, wherein, the active-matrix substrate further includes a pixel electrode formed on the protective film of the pixel forming portion, and the semiconductivity induction heat treatment is a heat treatment for crystallizing a transparent metal that constitutes the pixel electrode when the pixel electrode is formed.

In a nineteenth aspect of the present invention, based on the sixteenth aspect of the present invention, wherein the semiconductivity induction heat treatment is a heat treatment performed after a resin is applied to the pixel forming portion as the orientation film.

In a twentieth aspect of the present invention, based on the sixteenth aspect of the present invention, wherein, the active-matrix substrate further includes a display portion inspection circuit configured to inspect whether there is any short circuit between the signal lines formed in the display portion, and the display portion inspection circuit inspects whether there is any short circuit between the signal lines without requiring the coupling conductor lines to be severed from the active-matrix substrate after the semiconductivity induction heat treatment.

Effect of the Invention

In the first aspect, the coupling conductor line provided outside the display portion couples adjacent signal lines by the coupling lines including oxide semiconductor films and disposed between the signal lines, either the scanning signal lines or the data signal lines, or both. If the oxide semiconductor films continue to be conductive, electrostatic charge moves between the signal lines connected by the coupling lines, with the result that the signal lines have the same potential. On the other hand, by performing a heat treatment on the oxide semiconductor films at a predetermined temperature, the oxide semiconductor films are changed from conductive to semiconductive, thereby insulating the signal lines connected by the coupling lines from one another. Accordingly, during the manufacturing process, when any step in which electrostatic charge is likely to occur is performed, the oxide semiconductor films are left conductive, whereby static electricity that is charging some of the signal lines moves to other signal lines through the coupling conductor line. As a result, it becomes less likely for a high voltage to be generated between the signal lines, with the result that the occurrence of electrostatic discharge is suppressed. On the other hand, when such steps in which static electricity is likely to occur are completed during the manufacturing process, a semiconductivity induction heat treatment is performed to change the oxide semiconductor films from conductive to semiconductive. The signal lines are electrically isolated from one another, which eliminates the need to sever an electrostatic discharge prevention circuit from the display portion during a subsequent step. Thus, the cost of manufacturing the active-matrix substrate can be reduced.

In the sixteenth aspect, during the procedures from forming the protective film to protect the pixel forming portion to forming the orientation film on the pixel forming portion, oxide semiconductor films included in coupling lines and positioned between insulating films are thermally treated by the semiconductivity induction heat treatment capable of changing the oxide semiconductor films from conductive to semiconductive. As a result, upon completion of most of the steps in which electrostatic charge is likely to occur, the oxide semiconductor layers change from conductive to semiconductive, and the signal lines connected to the coupling lines are electrically isolated, whereby it is possible to perform a panel inspection thereafter without severing the coupling conductor line from the display portion. Thus, the need for the step of severing the coupling conductor line is eliminated, so that the cost of manufacturing the active-matrix substrate can be reduced.

BRIEF DESCRIPTION OF THE DRAWINGS

FIG. 2 provides cross-sectional views illustrating structures of coupling lines in a coupling conductor line provided in the liquid crystal panel shown in FIG. 1; more specifically, part (A) is a cross-sectional view illustrating a structure of a coupling line connecting adjacent scanning signal lines, part (B) is a cross-sectional view illustrating a structure of a coupling line connecting adjacent data signal lines, and part (C) is a cross-sectional view illustrating a structure of a coupling line connecting a scanning signal line and a data signal line.

FIG. 9 provides cross-sectional views illustrating structures of coupling lines each electrically connecting two adjacent scanning signal lines of the liquid crystal panel shown in FIG. 7; more specifically, part (A) is a cross-sectional view illustrating a structure of a coupling line in which two scanning signal lines are connected via a connection line and an IGZO film, part (B) is a cross-sectional view illustrating a structure of a coupling line in which two scanning signal lines are connected by an IGZO film, and part (C) is a cross-sectional view illustrating another structure of the coupling line in which two scanning signal lines are directly connected by an IGZO film.

FIG. 11 provides cross-sectional views illustrating structures of coupling lines electrically connecting a data signal line and a scanning signal line of the liquid crystal panel shown in FIG. 7; more specifically, part (A) is a cross-sectional view illustrating a structure of a coupling line in which the scanning signal line and the data signal line are directly connected via an IGZO film, and part (B) is a cross-sectional view illustrating a structure of a coupling line in which the data signal line and the scanning signal line are connected via an IGZO film and a connection line.

FIG. 12 provides cross-sectional views illustrating structures of TFTs used in a panel inspection circuit of the liquid crystal panel shown in FIG. 7; more specifically, part (A) is a cross-sectional view illustrating the structure of a bottom-gate TFT connected to a line extending from a data signal line, and part (B) is a cross-sectional view illustrating the structure of a top-gate TFT connected to lines extending from a scanning signal line.

FIG. 13 provides views illustrating the bottom-gate TFT connected to a line extending from a scanning signal line of the panel inspection circuit; more specifically, part (A) is a cross-sectional view of the bottom-gate TFT connected to the line, part (B) is a cross-sectional view illustrating a structure in which the scanning signal line is joined to a line formed simultaneously with data signal lines, so as to obtain the TFT shown in part (A), and part (C) is a cross-sectional view illustrating another structure in which the scanning signal line is joined to a line formed simultaneously with the data signal lines, so as to obtain the TFT shown in part (A).

FIG. 22 provides cross-sectional views illustrating structures of coupling lines electrically connecting two adjacent scanning signal lines of the liquid crystal panel shown in FIG. 7, where a channel-etched TFT is used; more specifically, part (A) is a cross-sectional view illustrating a structure of a coupling line in which two adjacent scanning signal lines are electrically connected via a connection line and an IGZO film, part (B) is a cross-sectional view illustrating a structure of a coupling line in which two scanning signal lines are directly connected by an IGZO film, and part (C) is a cross-sectional view illustrating another structure of the coupling line in which two scanning signal lines are directly connected by an IGZO film.

FIG. 24 provides cross-sectional views illustrating structures of coupling lines electrically connecting a data signal line and a scanning signal line of the liquid crystal panel shown in FIG. 7, where a channel-etched TFT is used; more specifically, part (A) is a cross-sectional view illustrating a structure of a coupling line in which the data signal line and the scanning signal line are connected via an IGZO film, and part (B) is a cross-sectional view illustrating a structure of a coupling line in which the data signal line and the scanning signal line are connected via an IGZO film and a connection line.

FIG. 25 provides cross-sectional views illustrating coupling lines including gate electrodes; more specifically, part (A) is a cross-sectional view illustrating a structure of a coupling line in which a gate electrode is disposed below an IGZO film connecting two adjacent scanning signal lines, and part (B) is a cross-sectional view illustrating a structure of a coupling line in which a gate electrode is disposed below an IGZO film connecting two adjacent scanning signal lines.

MODES FOR CARRYING OUT THE INVENTION

<1. Basic Study>

Before describing a liquid crystal panel of a liquid crystal display device according to each embodiment of the present invention and a method for manufacturing the same, a liquid crystal panel used for a basic study and a method for manufacturing the same will be described.

<1.1 Configuration of the Liquid Crystal Panel>

Figure 1:
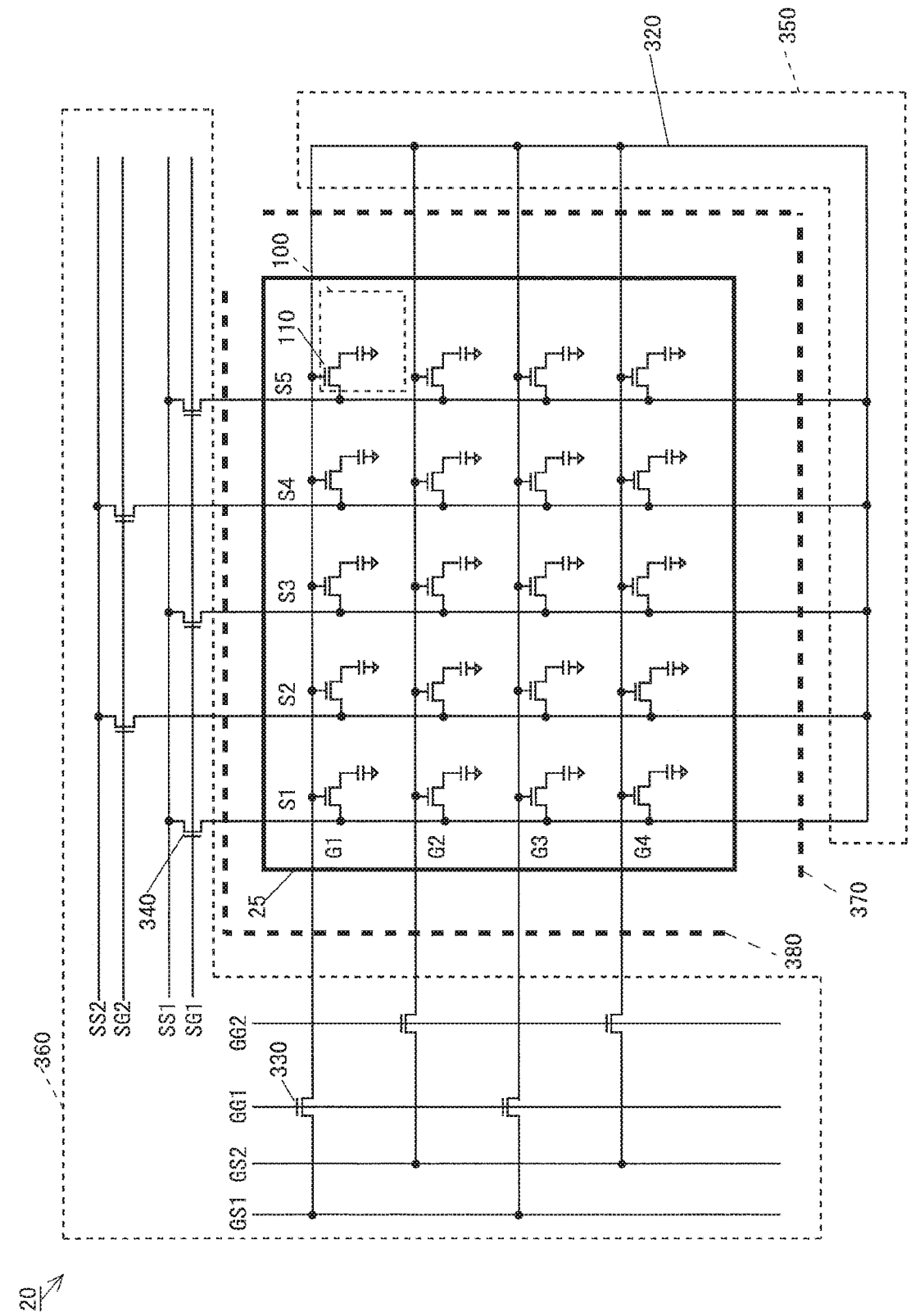
FIG. 1 is a diagram illustrating the configuration of a liquid crystal panel used for a basic study.

FIG. 1 is a diagram illustrating the configuration of the liquid crystal panel 20 used for the basic study. As shown in FIG. 1, the liquid crystal panel 20 includes a display portion 25, an electrostatic discharge prevention circuit 350 for suppressing the occurrence of ESD, and a panel inspection circuit 360 for inspecting whether there is any short circuit between lines of the display portion 25, and the electrostatic discharge prevention circuit 350 and the panel inspection circuit 360 are formed outside the display portion 25.

As will be described later, the display portion 25 has formed thereon m data signal lines $S_1$ to $S_m$, n scanning signal lines $G_1$ to $G_n$, and (m×n) pixel forming portions 100 arranged corresponding to intersections thereof. However, in FIG. 1, for convenience of illustration, the display portion 25 includes four scanning signal lines $G_1$ to $G_4$, five data signal lines $S_1$ to $S_5$, and 20 pixel forming portions 100 arranged corresponding to intersections thereof.

Below and to the right of the display portion 25 shown in FIG. 1, ends of the data signal lines $S_1$ to $S_5$ are coupled by a coupling conductor line 320, and ends of the scanning signal lines $G_1$ to $G_4$ are also coupled by the coupling conductor line 320. Accordingly, even if some of the scanning signal lines $G_1$ to $G_4$ and the data signal lines $S_1$ to $S_5$ are charged by static electricity, the static electricity charge is diffused to other signal lines through the coupling conductor line 320, with the result that the data signal lines $S_1$ to $S_5$ and the scanning signal lines $G_1$ to $G_4$ have the same potential. This suppresses the occurrence of ESD. In this manner, the coupling conductor line 320 included in the electrostatic discharge prevention circuit 350 couples the data signal lines $S_1$ to $S_5$ and the scanning signal lines $G_1$ to $G_4$, thereby preventing ESD from occurring. Note that specific features of the coupling conductor line 320 will be described below.

Above the display portion 25, ends of the data signal lines $S_1$ to $S_5$ are connected to respective TFTs 340, such that of the data signal lines $S_1$ to $S_5$ connected to the TFTs 340, the even-numbered data signal lines $S_2$ and $S_4$ are connected to a line $SS_2$, and the odd-numbered data signal lines $S_1$, $S_3$, and $S_5$ are connected to a line $SS_1$. As for gate electrodes of the TFTs 340, the gate electrodes of the TFTs 340 connected to the even-numbered data signal lines $S_2$ and $S_4$ are connected to a line $SG_2$, and the gate electrodes of the TFTs 340 connected to the odd-numbered data signal lines $S_1$, $S_3$, and $S_5$ are connected to a line $SG_1$.

Similarly, to the left of the display portion 25, ends of the scanning signal lines $G_1$ to $G_4$ are connected to respective TFTs 330, such that of the scanning signal lines $G_1$ to $G_4$ connected to the TFTs 330, the even-numbered scanning signal lines $G_2$ and $G_4$ are connected to a line $GS_2$, and the odd-numbered scanning signal lines $G_1$ and $G_3$ are connected to a line $GS_1$. As for gate electrodes of the TFTs 330, the gate electrodes of the TFTs 330 connected to the even-numbered scanning signal lines $G_2$ and $G_4$ are connected to a line $GG_2$, and the gate electrodes of the TFTs 330 connected to the odd-numbered scanning signal lines $G_1$ and $G_3$ are connected to a line $GG_1$. As will be described in detail later, the panel inspection circuit 360 including these lines is capable of inspecting whether there is any short circuit between the signal lines of the liquid crystal panel 20.

<1.2 Electrostatic Discharge Prevention Circuit>

In the process of manufacturing the liquid crystal panel 20, static electricity might occur during the steps of, for example, forming a conductive film using plasma CVD (chemical vapor deposition) and patterning the conductive film by dry or wet etching using a photoresist as a mask, with the result that the scanning signal lines $G_1$ to $G_4$ and the data signal lines $S_1$ to $S_5$ are electrostatically charged.

However, since the data signal lines $S_1$ to $S_5$ and the scanning signal lines $G_1$ to $G_4$ are coupled by the coupling conductor line 320, even if some of the signal lines are charged by static electricity generated during some steps of the manufacturing process, the electrostatic charge moves to other signal lines through the coupling conductor line 320 so as to be uniformly distributed. As a result, the data signal lines $S_1$ to $S_5$ and the scanning signal lines $G_1$ to $G_4$ have the same potential, and therefore, no high voltage is applied between adjacent signal lines, which suppresses the occurrence of ESD.

FIG. 2 provides cross-sectional views illustrating structures of coupling lines in the coupling conductor line 320; more specifically, FIG. 2(A) is a cross-sectional view illustrating a structure of the coupling line connecting adjacent scanning signal lines $G_1$ and $G_2$, FIG. 2(B) is a cross-sectional view illustrating a structure of a coupling line connecting adjacent data signal lines $S_1$ and $S_2$, and FIG. 2(C) is a cross-sectional view illustrating a structure of a coupling line connecting a scanning signal line G and a data signal line S.

The adjacent scanning signal lines $G_1$ and $G_2$ formed on the insulating substrate 101 are coupled by a connection line CL which is formed simultaneously with the data signal lines during the step of forming the data signal lines, through contact holes provided through a gate insulating film 103 and an etch-stop layer 105a, as shown in FIG. 2(A). Moreover, the adjacent data signal lines $S_1$ and $S_2$ formed on the etch-stop layer 105a are coupled by a connection line CL which is formed simultaneously with pixel electrodes during the process of forming the pixel electrodes, through contact holes provided in a passivation film 108, as shown in FIG. 2(B). Further, the scanning signal line G and the data signal line S are coupled by another connection line CL which is formed simultaneously with the pixel electrodes during the step of forming the pixel electrodes, through a contact hole provided so as to reach the scanning signal line G and a contact hole provided so as to reach the data signal line S, as shown in FIG. 2(C).

The electrostatic discharge prevention circuit 350, which includes the coupling conductor line 320 coupling the scanning signal lines $G_1$ to $G_4$ and the data signal lines $S_1$ to $S_5$ as above, is provided, thereby avoiding a short circuit between the signal lines that should be insulated, such as between the data signal lines $S_1$ to $S_5$, between the scanning signal lines $G_1$ to $G_4$, and between the data signal lines $S_1$ to $S_5$ and the scanning signal lines $G_1$ to $G_4$.

Thereafter, before the panel inspection circuit 360 inspects whether there is any short circuit between the signal lines, the electrostatic discharge prevention circuit 350 is severed from the liquid crystal panel 20 along a first cut line 370 shown in FIG. 1 in order to remove the coupling conductor line 320, which maintains the data signal lines $S_1$ to $S_5$ and the scanning signal lines $G_1$ to $G_4$ at the same potential. As a result, the data signal lines $S_1$ to $S_5$ and the scanning signal lines $G_1$ to $G_4$ are electrically isolated from each another.

<1.3 Panel Inspection Circuit>

Even when the liquid crystal panel 20 is provided with the electrostatic discharge prevention circuit 350, ESD might cause breakage of the insulating film and hence a short circuit between conductors, which should be insulated. Accordingly, the panel inspection circuit 360 is provided in order to inspect whether there is any short circuit caused and not prevented by the electrostatic discharge prevention circuit 350.

In a state where the electrostatic discharge prevention circuit 350 is isolated, for example, when a high-level voltage is applied to the gate electrodes of the TFTs 330 connected to the even-numbered scanning signal lines $G_2$ and $G_4$, thereby turning on the TFTs 330 and also the TFTs 340 connected to the data signal lines $S_1$ to $S_5$, whereby a predetermined voltage is applied to the lines $SS_1$ and $SS_2$, only the pixel forming portions 100 that are connected to the even-numbered scanning signal lines $G_2$ and $G_4$ should be lit up by a predetermined voltage being written thereto. However, if some of the pixel forming portions 100 connected to the odd-numbered scanning signal lines $G_1$, $G_3$, and $G_5$ are lit up at the same time, it is apparent that there is a short circuit at least between one of the odd-numbered scanning signal lines $G_1$, $G_3$, and $G_5$ connected to the pixel forming portions 100 that are being lit up and one of the even-numbered scanning signal lines $G_2$ and $G_4$ adjacent to that scanning signal line.

Similarly, for example, by applying a high-level voltage to the gate electrodes of the TFTs 330 connected to the scanning signal lines $G_1$ to $G_4$, thereby applying a predetermined voltage to the even-numbered data signal lines $S_2$ and $S_4$, it is rendered possible to inspect whether there is a short circuit caused between any one of the even-numbered data signal lines $S_2$ and $S_4$ and any one of the odd-numbered data signal lines $S_1$, $S_3$, and $S_5$ adjacent to that data signal line.

In this manner, the panel inspection circuit 360 is used to ensure that there is no short circuit between the scanning signal lines $G_1$ to $G_4$, between the data signal lines $S_1$ to $S_5$, nor between the scanning signal lines $G_1$ to $G_4$ and the data signal lines $S_1$ to $S_5$, and thereafter, the panel inspection circuit 360 is severed from the liquid crystal panel 20 along a second cut line 380.

<1.4 Method for Manufacturing the Liquid Crystal Panel>

Figure 3:
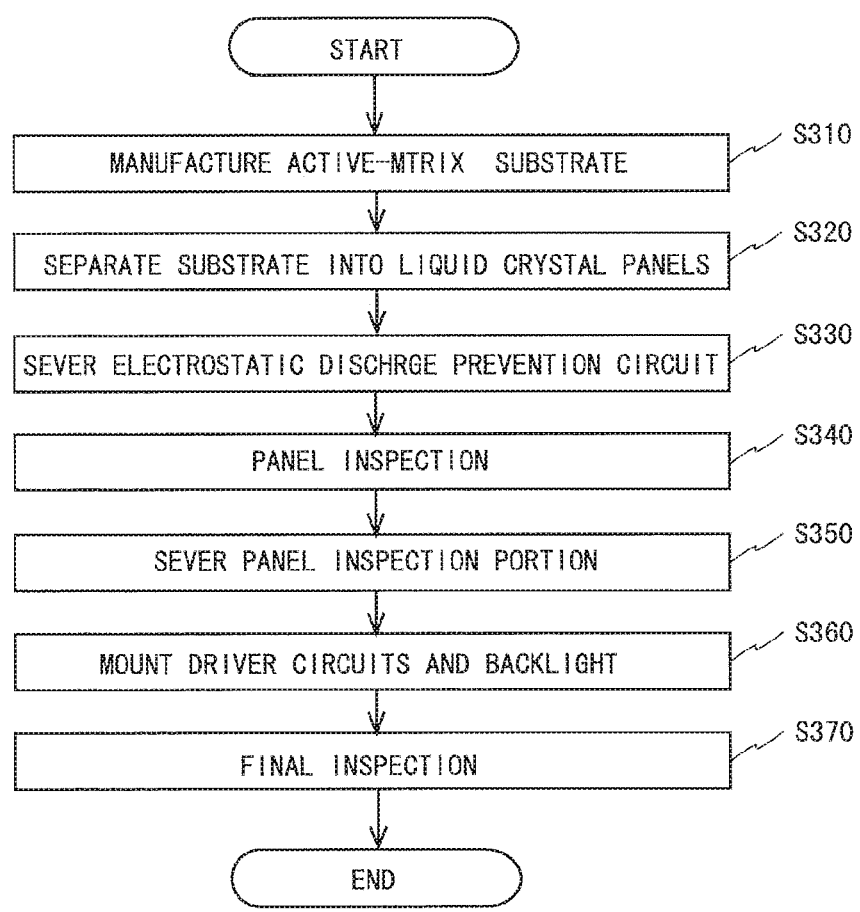
FIG. 3 is a flowchart showing a method for manufacturing a liquid crystal display device including the liquid crystal panel shown in FIG. 1.

FIG. 3 is a flowchart showing the method for manufacturing liquid crystal display devices including liquid crystal panels 20 as shown in FIG. 1. At step S310, a plurality of liquid crystal panels 20 are formed on an insulating substrate 101 such as a glass substrate, thereby manufacturing an active-matrix substrate. Each liquid crystal panel 20 includes pixel forming portions 100, each having formed thereon a TFT 110 whose channel layer is made of amorphous silicon. The active-matrix substrate is manufactured by a widely known production process, and therefore, each production step will not be elaborated upon.

At step S320, the active-matrix substrate is cut into each individual liquid crystal panel 20. At step S330, an electrostatic discharge prevention circuit 350, which includes a coupling conductor line 320 coupling scanning signal lines $G_1$ to $G_4$ and data signal lines $S_1$ to $S_5$, is severed from the liquid crystal panel 20 along a first cut line 370 in order to allow the panel to be inspected. As a result, the scanning signal lines $G_1$ to $G_4$ and the data signal lines $S_1$ to $S_5$ are electrically isolated from each other.

At step S340, the panel inspection circuit 360 is used to perform a panel inspection as to whether there is any short circuit between the scanning signal lines $G_1$ to $G_4$, between the data signal lines $S_1$ to $S_5$, or between the scanning signal lines $G_1$ to $G_4$ and the data signal lines $S_1$ to $S_5$. At step S350, for each liquid crystal panel 20 for which no short circuit has been found, the panel inspection circuit 360 is severed from the liquid crystal panel 20 along a second cut line 380.

At step S360, a scanning signal line driver circuit 30, a data signal line driver circuit 40, a backlight unit, and other components are mounted on the liquid crystal panel 20, thereby manufacturing a liquid crystal display device, and at step S370, the liquid crystal display device is subjected to a final inspection, including tests for these mounted components.

The electrostatic discharge prevention circuit 350 is formed during the process of manufacturing the active-matrix substrate, and therefore, it is possible to suppress the occurrence of ESD due to electrostatic charge generated during the manufacturing process. However, the electrostatic discharge prevention circuit 350 is required to be severed along the first cut line 370 before the panel inspection, and the panel inspection circuit 360 is required to be severed along the second cut line 380 after the panel inspection, with the result that the cost of manufacturing the liquid crystal display device increases.

2. First Embodiment

<2.1 Configuration and General Operation of the Liquid Crystal Display Device>

Figure 4:
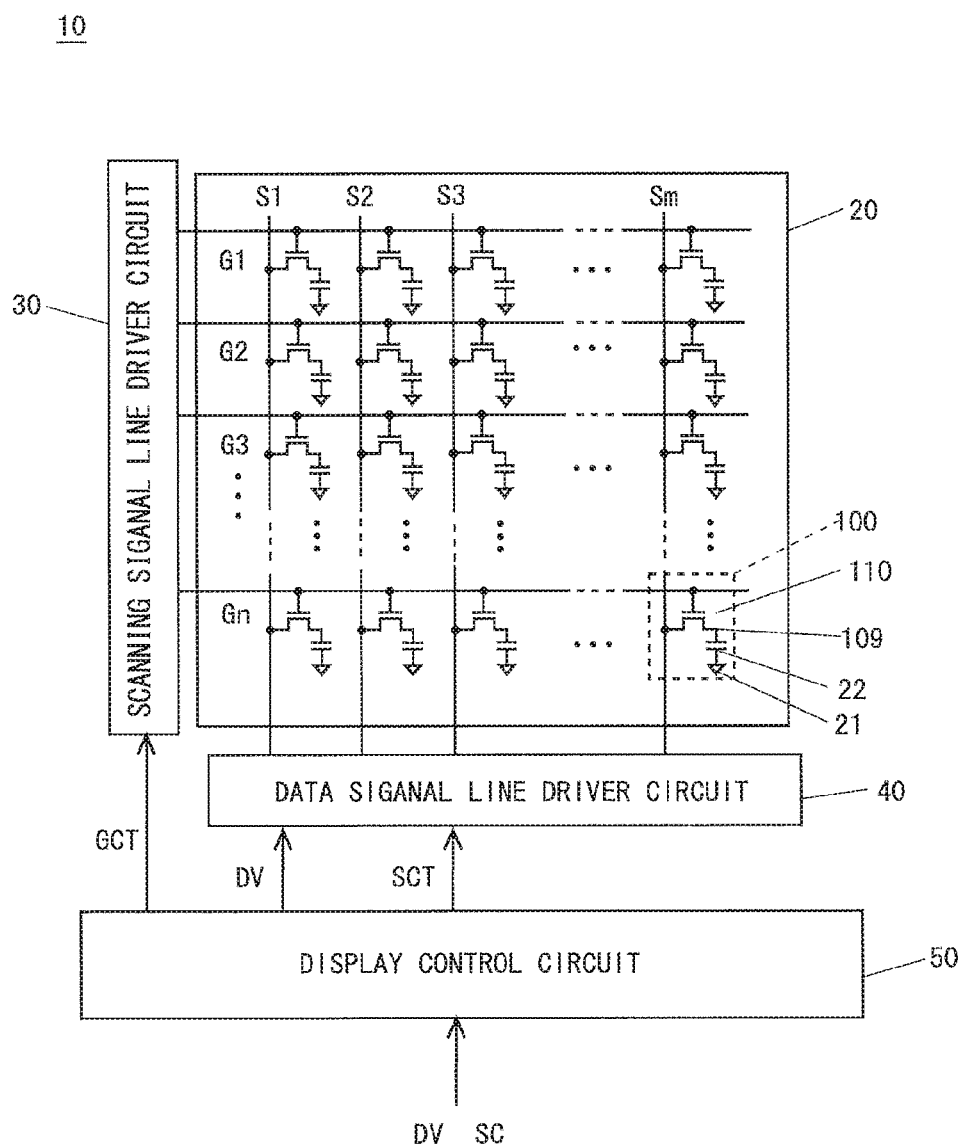
FIG. 4 is a block diagram illustrating the configuration of a liquid crystal display device according to a first embodiment of the present invention.

FIG. 4 is a block diagram illustrating the configuration of a liquid crystal display device 10 according to a first embodiment of the present invention. The liquid crystal display device 10 includes a liquid crystal panel 20, a scanning signal line driver circuit 30, a data signal line driver circuit 40, and a display control circuit 50, as shown in FIG. 4. Note that an electrostatic discharge prevention circuit and a panel inspection circuit, which will be described later, remain around the liquid crystal panel 20. These circuits are required during the process of manufacturing the liquid crystal panel 20, but do not function for the liquid crystal display device 10, and therefore, the circuits are not shown in FIG. 4.

The liquid crystal panel 20 has formed therein m data signal lines $S_1$ to $S_m$, n scanning signal lines $G_1$ to $G_n$, and (m×n) pixel forming portions 100 arranged in a matrix corresponding to intersections of the data signal lines $S_1$ to $S_m$ and the scanning signal lines $G_1$ to $G_n$. The pixel forming portions 100 include thin-film transistors (TFTs) 110, which have gate electrodes connected to the scanning signal lines $G_1$ to $G_n$ passing through their respectively corresponding intersections and source electrodes connected to the data signal lines $S_1$ to $S_m$ passing through the intersections, pixel electrodes 109 connected to drain electrodes of the TFTs 110, a common electrode 21, which is provided in common for the pixel forming portions 100, and an unillustrated liquid crystal layer provided between the pixel electrodes 109 and the common electrode 21. Of the above, the pixel electrodes 109 and the common electrode 21, along with the liquid crystal layer provided therebetween, constitute liquid crystal capacitors 22 to hold image signal voltages written in the pixel forming portions 100.

Furthermore, the present invention takes advantage of a channel layer of the TFT 110 being changed from a conductor to a semiconductor by thermal treatment, and therefore, as the channel layer, an oxide semiconductor film, in particular, an In—Ga—Zn—O based semiconductor film (indium-gallium-zinc oxide) is used. Herein, the In—Ga—Zn—O based semiconductor film is denoted as the "IGZO film", and the channel layer is described as being made of the IGZO film. However, the oxide semiconductor film of which the channel layer is made is not limited to the IGZO film, and the channel layer may be made of another oxide semiconductor film. The oxide semiconductor film of which the channel layer is made and the TFT using the same will be described in detail later. Note that oxide semiconductor films, including the IGZO film, will also be referred to collectively as "oxide semiconductor films".

When the display control circuit 50 externally receives image data DV, which represents an image to be displayed, and control signals SC, such as vertical and horizontal synchronization signals, the display control circuit 50 generates a data signal line driver circuit control signal SCT, a scanning signal line driver circuit control signal GCT, etc., in accordance with the control signals SC. The display control circuit 50 provides the data signal line driver circuit control signal SCT and the image data DV to the data signal line driver circuit 40 and the scanning signal line driver circuit control signal GCT to the scanning signal line driver circuit 30.

The data signal line driver circuit 40 activates unillustrated internal components, such as a shift register and a sampling latch circuit, and converts the image data DV to analog signals by an unillustrated D/A conversion circuit, thereby generating image signal voltages. Then, the generated image signal voltages are outputted to the data signal lines $S_1$ to $S_m$ of the liquid crystal panel 20 at predetermined times determined by the data signal line driver circuit control signal SCT. The data signal line driver circuit control signal SCT includes a source start pulse signal, a source clock signal, and a latch strobe signal.

In response to the scanning signal line driver circuit control signal GCT, the scanning signal line driver circuit 30 activates unillustrated internal components, such as a shift register, thereby applying active scanning signals sequentially to the scanning signal lines $G_1$ to $G_n$. The scanning signal line driver circuit control signal GCT includes, for example, a gate clock signal and a gate start pulse signal.

In this manner, the image signal voltages are applied to the data signal lines $S_1$ to $S_m$, and the scanning signals are applied to the scanning signal lines $G_1$ to $G_n$, whereby the image signal voltages are written to the liquid crystal capacitors 22 through the TFTs 110 of the pixel forming portions 100. As a result, the liquid crystal panel 20 displays the image based on the externally received image data DV.

Figure 5:
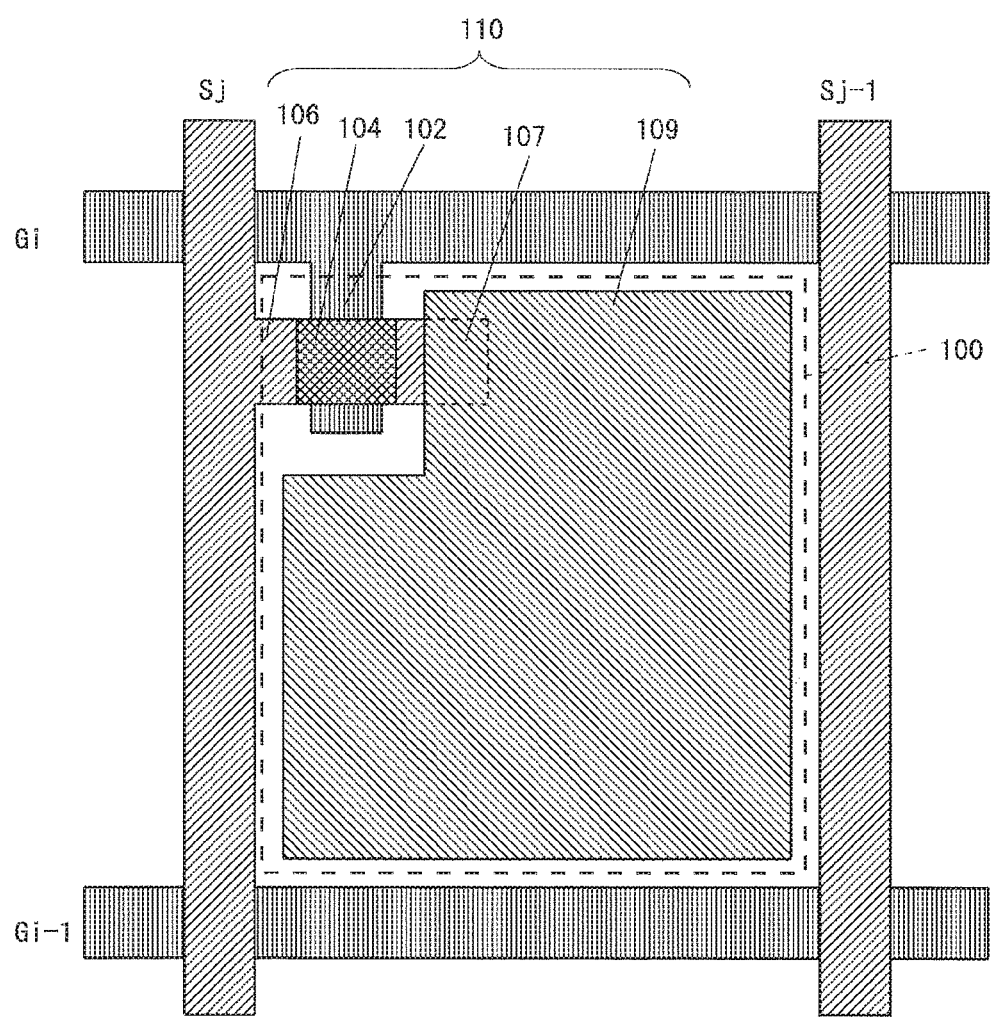
FIG. 5 is a plan view illustrating the configuration of a pixel forming portion formed in a display portion of a liquid crystal panel shown in FIG. 4.

FIG. 5 is a plan view illustrating the configuration of the pixel forming portion 100 formed in a display portion 25 of the liquid crystal panel 20 shown in FIG. 4. As shown in FIG. 5, the scanning signal lines $G_j$ and $G_{i-1}$, which extend horizontally, and the data signal lines $S_j$ and $S_{j-1}$, which extend vertically, are formed so as to surround the pixel forming portion 100, and the scanning signal lines $G_i$ and $G_{i-1}$ and the data signal lines $S_j$ and $S_{j-1}$ are isolated by an unillustrated insulating film so as not to be short-circuited. The scanning signal line $G_1$ is connected to the gate electrode 102 of the TFT 110, and the data signal line $S_1$ is connected to the source electrode 106 of the TFT 110. The TFT 110 has the drain electrode 107 connected to the pixel electrode 109.

Figure 6:
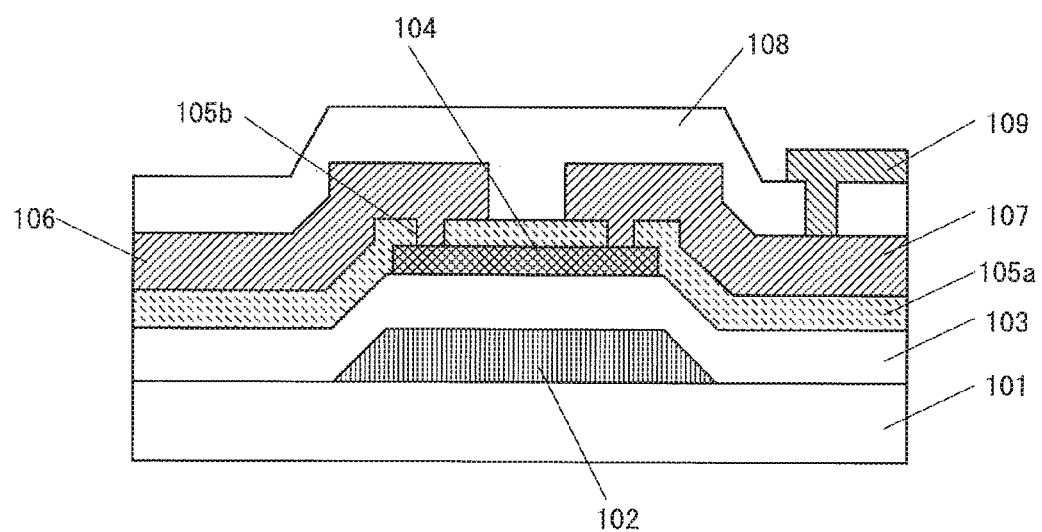
FIG. 6 is a cross-sectional view illustrating the structure of a bottom-gate TFT formed in the liquid crystal panel of the liquid crystal display device according to the first embodiment.

FIG. 6 is a cross-sectional view illustrating the structure of the TFT 110, which is of a bottom-gate type and is formed in the pixel forming portion 100 of the liquid crystal panel 20. As shown in FIG. 6, the gate electrode 102, which is made of a film stack obtained by stacking a molybdenum (Mo) film on an aluminum (Al) film, is formed on the insulating substrate 101, which is, for example, a glass substrate. The gate electrode 102 is covered with the gate insulating film 103, which is made of a film stack obtained by stacking a silicon oxide ($SiO_2$) film on a silicon nitride (SiNx) film. Note that the gate electrode 102 may be made of, for example, a film stack obtained by stacking sequentially, from bottom, a titanium (Ti) film, an aluminum film, and a titanium film, a film stack obtained by stacking a copper (Cu) film on a titanium film, or a film stack obtained by stacking a copper film on a molybdenum film.

Formed on the gate insulating film 103 is the channel layer 104 made of the IGZO film, and on the channel layer 104, an etch-stop layer 105a, which is made of a silicon oxide film and has contact holes 105b provided therein, is formed. As such, the channel layer 104 of the TFT 110 is positioned between the gate insulating film 103 and the etch-stop layer 105a, and both the upper layer of the gate insulating film 103 and the etch-stop layer 105a are formed of the silicon oxide film. Accordingly, the channel layer 104 is positioned between the silicon oxide films.

On the etch-stop layer 105a, the source electrode 106 and the drain electrode 107 are formed on opposite sides at a predetermined distance from each other. The source electrode 106 and the drain electrode 107 are electrically connected to the channel layer 104 through the respective contact holes 105b provided in the etch-stop layer 105a.

Note that the source electrode 106 and the drain electrode 107 are film stacks each obtained by stacking sequentially, from the substrate side, a titanium (Ti) film, an aluminum film, and a molybdenum film. Note that the source electrode 106 and the drain electrode 107 may be made of the same film stack as the gate electrode.

Furthermore, a passivation film 108 is formed so as to cover the entire surface including the source electrode 106 and the drain electrode 107. On the passivation film 108, the pixel electrode 109, which is made of a transparent metal film, ITO (indium tin oxide), is formed so as to be electrically connected to the drain electrode 107 through the passivation film 108. The passivation film 108 will also be referred to as the "protective film". Note that the TFT 110 has been described as a bottom-gate TFT but may be a channel-etched TFT. A case where the channel-etched TFT is used will be described later.

<2.2 Configuration of the Liquid Crystal Panel>

Figure 7:
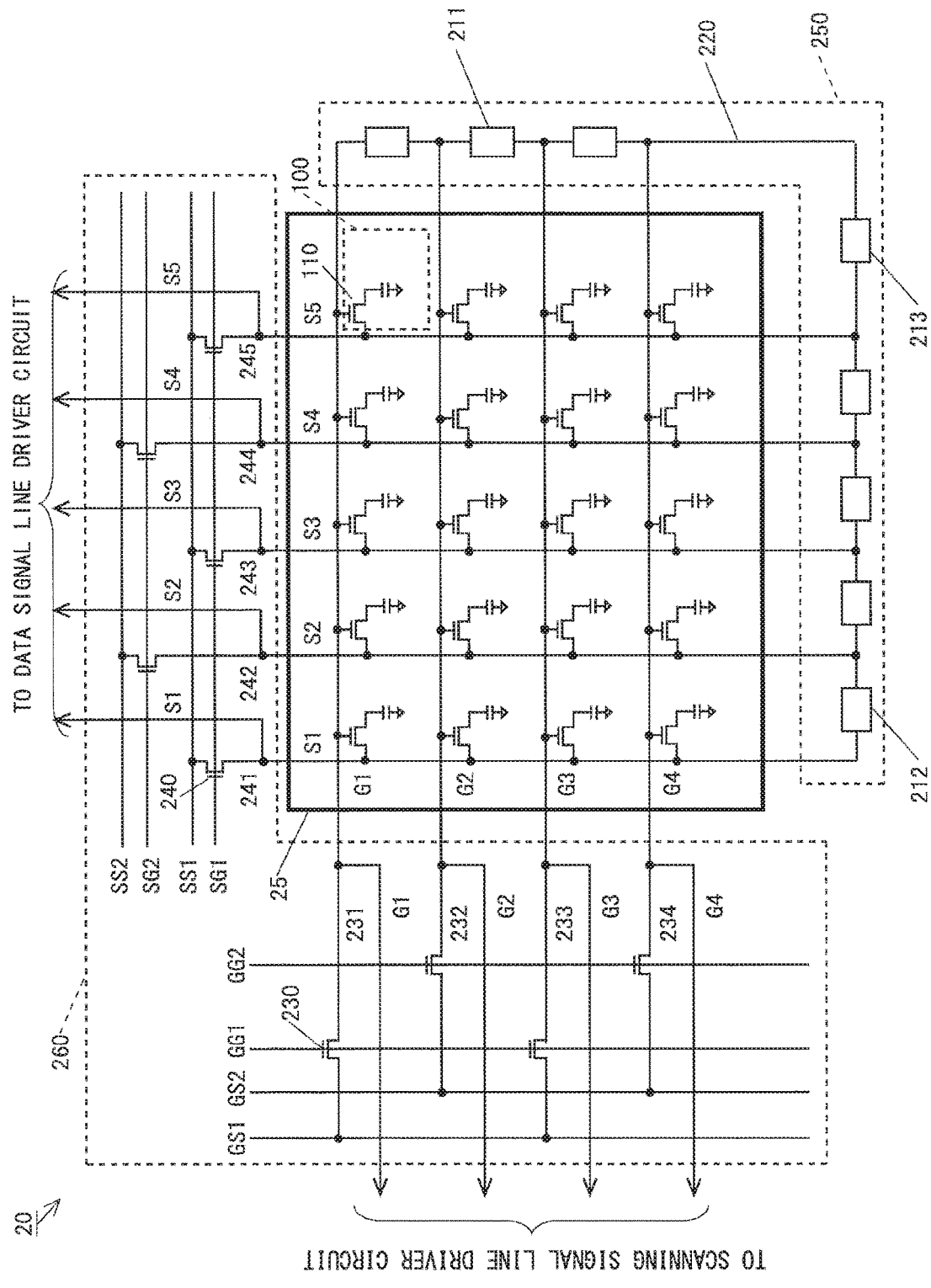
FIG. 7 is a diagram illustrating the configuration of the liquid crystal panel according to the first embodiment.

FIG. 7 is a diagram illustrating the configuration of the liquid crystal panel 20 according to the first embodiment of the present invention. As shown in FIG. 7, the liquid crystal panel 20 includes the display portion 25, an electrostatic discharge prevention circuit 250, which suppresses the occurrence of ESD, and a panel inspection circuit 260, which inspects whether there is any short circuit between lines provided in the display portion 25, and the electrostatic discharge prevention circuit 250 and the panel inspection circuit 260 are disposed outside the display portion 25. Note that in FIG. 7, as in FIG. 1, for convenience of illustration, the display portion 25 includes four scanning signal lines $G_1$ to $G_4$, five data signal lines $S_1$ to $S_5$, and 20 pixel forming portions 100 provided at intersections thereof.

<2.3 Electrostatic Discharge Prevention Circuit>

First, the electrostatic discharge prevention circuit 250 will be described. Below and to the right of the display portion 25 shown in FIG. 7, ends of the data signal lines $S_1$ to $S_5$ are all coupled by a coupling conductor line 220 included in the electrostatic discharge prevention circuit 250, ends of the scanning signal lines $G_1$ to $G_4$ are all coupled by the coupling conductor line 220 as well, and the data signal line $S_5$ and the scanning signal line $G_4$ are also coupled by the coupling conductor line 220. The coupling conductor line 220 includes coupling lines 211 for coupling adjacent scanning signal lines, coupling lines 212 for coupling adjacent data signal lines, and a coupling line 213 for coupling a scanning signal line and a data signal line adjacent thereto. Each of the coupling lines 211 to 213 is disposed between the signal lines that are to be coupled thereby.

<2.4 Electrical Characteristics of the IGZO Film and Configuration of the Coupling Line>

Figure 8:
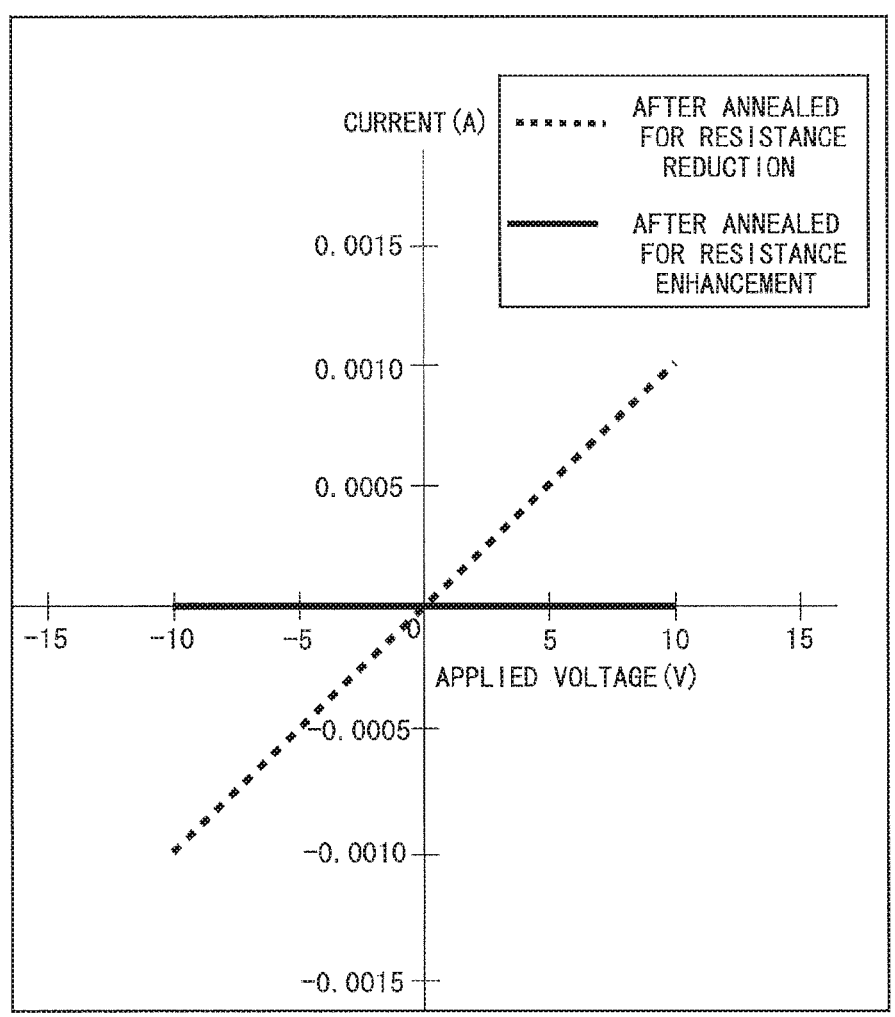
FIG. 8 is a graph showing electrical characteristics of an IGZO film included in a coupling line of the liquid crystal panel shown in FIG. 7.

FIG. 8 is a graph showing electrical characteristics of the IGZO film. In FIG. 8, the horizontal axis represents a voltage applied to opposite ends of the IGZO film, and the vertical axis represents a current flowing through the IGZO film. The electrical characteristics of the IGZO film change significantly depending on annealing (heat treatment) conditions. Accordingly, the relationship between the annealing conditions and the electrical characteristics of the IGZO film will be described.

The IGZO film is annealed at a temperature of from 350° C. to 450° C. for approximately one hour immediately after the formation on the silicon oxide film. The annealing is performed in order to suppress characteristic variations among the TFTs whose channel layers are made of the IGZO film. Thereafter, when forming the etch-stop film on the IGZO film, the insulating substrate with the IGZO film formed thereon is heated in a vacuum at 200 to 300° C., more preferably, at 250° C. At this time, the IGZO film overlies the silicon oxide film included in the gate insulating film 103 and is heated without being covered with any silicon oxide film, and therefore, the IGZO film is rendered conductive. Values of current flowing through such a conductive IGZO film are measured while applying voltages of from −10V to 10V to opposite ends of the IGZO film. As a result, the flowing current is proportional to the applied voltage as shown by a dotted line in FIG. 8. From this, it can be appreciated that the annealing turns the IGZO film into a conductor having a resistance of approximately 10 kΩ.

It should be noted that the heat treatment that is performed on the IGZO film at 200 to 300° C. without any silicon oxide film formed on the IGZO film, in order to render the IGZO film conductive, will also be referred to as the "conductivity induction treatment". Moreover, the conductivity induction treatment for rendering the IGZO film conductive is not limited to the heat treatment for heating the insulating substrate in order to form the etch-stop film, and any heat treatments performed for other processes may be employed so long as the IGZO film is heated to 200 to 300° C. when the IGZO film is not covered with any silicon oxide film. Moreover, the conductivity induction treatment encompasses not only the heat treatment of the IGZO film but also a hydrogen or argon plasma treatment performed on the IGZO film in order to render the IGZO film conductive.

Next, the IGZO film that has been rendered conductive by the conductivity induction treatment is annealed at a temperature of from 200° C. to 350° C. for approximately one hour. After the annealing, voltages are applied to opposite ends of the IGZO film, and values of current flowing through the IGZO film are measured. As a result, little current flows therethrough, as indicated by a solid line in FIG. 8. The IGZO film is essentially an oxide semiconductor, and therefore, conceivably, changes from a conductor to a semiconductor because of the annealing. Accordingly, if the TFT that is formed has a channel layer made of such an IGZO film, a current flows through the IGZO film in accordance with a gate voltage. However, each coupling line included in the coupling conductor line 220 is not provided with a gate electrode, as will be described later, and therefore, the IGZO film functions substantially as an insulator. The annealing that is intended to change the IGZO film from a conductor to a semiconductor, as above, will also be referred to as the "semiconductivity induction annealing" or the "semiconductivity induction heat treatment". Note that when the IGZO film that has been rendered conductive by the conductivity induction treatment is annealed at a temperature lower than 200° C. or at a temperature higher than 350° C., the IGZO film does not change from a conductor to a semiconductor.

The IGZO film, which remains a conductor or changes from a conductor to a semiconductor, depending on the annealing temperature, as described above, is used as a part of the coupling conductor line 220, so that the scanning signal lines $G_1$ to $G_4$ and the data signal lines $S_1$ to $S_5$, which are coupled by the coupling conductor line 220, can be electrically connected at the same potential or can be electrically isolated from each other.

Therefore, in the case where the scanning signal lines $G_1$ to $G_4$ and the data signal lines $S_1$ to $S_5$ are coupled by the coupling conductor line 220 in which the IGZO film is a conductor, even if some of the signal lines are electrostatically charged during the manufacturing process, the static electricity charge moves through the coupling conductor line 220, with the result that the scanning signal lines $G_1$ to $G_4$ and the data signal lines $S_1$ to $S_5$ have the same potential. Thus, even if electrostatic charge occurs during the manufacturing process, the occurrence of ESD is suppressed.

On the other hand, in the case where the scanning signal lines $G_1$ to $G_4$ and the data signal lines $S_1$ to $S_5$ are coupled by the coupling conductor line 220 in which the IGZO film is a semiconductor, the scanning signal lines $G_1$ to $G_4$ and the data signal lines $S_1$ to $S_5$ are isolated from each other, so that no current flows between the signal lines through the coupling conductor line 220. Thus, even if the coupling conductor line 220 is not uncoupled, the signal lines are electrically isolated from each other, so that the liquid crystal display device 10 operates normally.

The reason why the semiconductivity induction heat treatment performed on the IGZO film between the silicon oxide films, as described above, changes the IGZO film from a conductor to a semiconductor is unknown. However, the present inventors presume that when the IGZO film positioned between the silicon oxide films is thermally treated at a temperature of from 200° C. to 350° C., the silicon oxide films supply the IGZO film with oxygen, and the supplied oxygen occupies the position of oxygen lost from the IGZO film, whereby the IGZO film becomes a stable semiconductor.

Next, specific structures of the coupling lines included in the coupling conductor line 220 and disposed between the signal lines will be described. FIG. 9 provides cross-sectional views illustrating structures of the coupling lines 211 each electrically connecting adjacent scanning signal lines; more specifically, FIG. 9(A) is a cross-sectional view illustrating a structure of the coupling line 211 in which scanning signal lines $G_a$ and $G_b$ are connected via a connection line CL and an IGZO film 104c, FIG. 9(B) is a cross-sectional view illustrating a structure of the coupling line 211 in which the scanning signal lines $G_a$ and $G_b$ are directly connected by the IGZO film 104c, and FIG. 9(C) is a cross-sectional view illustrating another structure of the coupling line 211 in which the scanning signal lines $G_a$ and $G_b$ are directly connected by the IGZO film 104c.

In the case of the coupling line 211 shown in FIG. 9(A), the connection line CL is connected to the scanning signal lines $G_a$ and $G_b$ through respective contact holes provided through the gate insulating film 103 and the etch-stop layer 105a. Moreover, the connection line CL is connected to the IGZO film 104c through contact holes provided in the etch-stop layer 105a. As a result, the scanning signal lines $G_a$ and $G_b$ formed on the insulating substrate 101 are connected via the connection line CL, which is formed simultaneously with the data signal lines, and the IGZO film 104c.

In the case of the coupling line 211 shown in FIG. 9(B), the IGZO film 104c is connected to the scanning signal lines $G_a$ and $G_b$ through respective contact holes provided in the gate insulating film 103. As a result, the scanning signal lines $G_a$ and $G_b$ formed on the insulating substrate 101 are connected simply via the IGZO film 104c.

In the case of the coupling line 211 shown in FIG. 9(C), the IGZO film 104c is formed on the insulating substrate 101, and each of the scanning signal lines $G_a$ and $G_b$ is directly connected to the IGZO film 104c. As a result, the scanning signal lines $G_a$ and $G_b$ formed on the insulating substrate 101 are connected simply via the IGZO film 104c.

In this manner, in any of the coupling lines 211, the scanning signal lines $G_a$ and $G_b$ are not directly connected, and at least the IGZO film 104c is positioned therebetween, so that when the IGZO film 104c is a conductor, the scanning signal lines $G_a$ and $G_b$ are electrically connected via the IGZO film 104c. However, the coupling line 211 is not provided with any electrically conductive line that can take the place of the IGZO film 104c, and therefore, when the IGZO film 104c is a semiconductor, the scanning signal lines $G_a$ and $G_b$ are electrically insulated. Moreover, as can be appreciated from FIGS. 9(A) to 9(C), the conductive IGZO film 104c is positioned between the silicon oxide films, which are formed in contact with top and bottom surfaces of the IGZO film 104c. Accordingly, the IGZO film 104c of the coupling line 211 is rendered conductive by the conductivity induction treatment and also rendered semiconductive by the semiconductivity induction heat treatment. Note that specific procedures for performing the conductivity induction treatment and the semiconductivity induction heat treatment will be described later.

Figure 10:
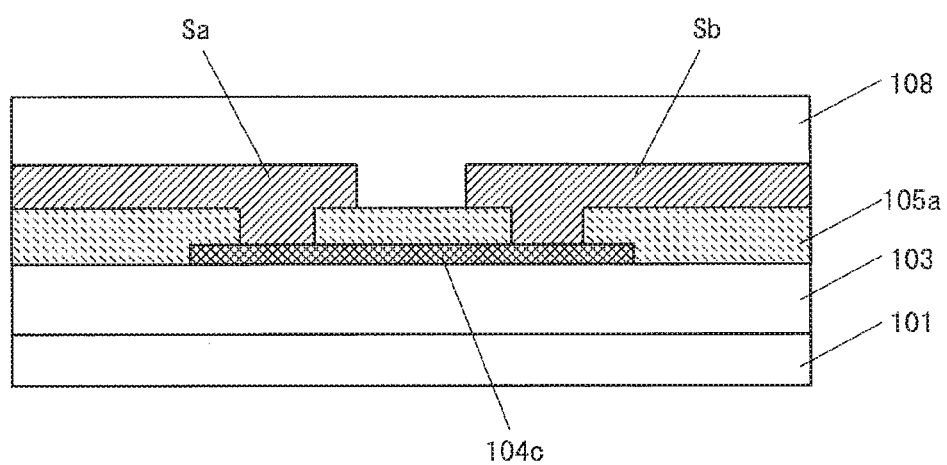
FIG. 10 is a cross-sectional view illustrating the structure of a coupling line connecting two adjacent data signal lines of the liquid crystal panel shown in FIG. 7.

FIG. 10 is a cross-sectional view illustrating the structure of the coupling line 212 that connects adjacent data signal lines $S_a$ and $S_b$. As shown in FIG. 10, the data signal lines $S_a$ and $S_b$ are formed on the etch-stop layer 105a and connected to the IGZO film 104c formed on the gate insulating film, through contact holes provided in the etch-stop layer 105a.

In this manner, in the case of the coupling line 212 also, the data signal lines $S_a$ and $S_b$ are not directly connected, and the IGZO film 104c is positioned therebetween, whereby the data signal lines $S_a$ and $S_b$ are electrically connected via the IGZO film 104c when the IGZO film 104c is a conductor. However, the coupling line 212 is not provided with any electrically conductive line that can take the place of the IGZO film 104c, and therefore, when the IGZO film 104c is a semiconductor, the data signal lines $S_a$ and $S_b$ are electrically insulated because the coupling line 212 is not provided with any other line to connect the data signal lines $S_a$ and $S_b$, except for the IGZO film 104c. Moreover, as can be appreciated from FIG. 10, the IGZO film 104c rendered conductive is positioned between the silicon oxide films, which are formed in contact with top and bottom surfaces of the IGZO film 104c. Accordingly, the IGZO film 104c is rendered conductive by the conductivity induction treatment and also rendered semiconductive by the semiconductivity induction heat treatment.

FIG. 11 provides cross-sectional views illustrating structures of coupling lines 213 electrically connecting a data signal line S and a scanning signal line G; more specifically, FIG. 11(A) is a cross-sectional view illustrating a structure of a coupling line 213 in which the scanning signal line G and the data signal line S are directly connected to an IGZO film 104c, and FIG. 11(B) is a cross-sectional view illustrating a structure of a coupling line 213 in which the scanning signal line G and the data signal line S are connected via an IGZO film 104c and a connection line CL.

In the case of the coupling line 213 shown in FIG. 11(A), the scanning signal line G is formed on the insulating substrate 101 and connected to the IGZO film 104c via a contact hole provided in the gate insulating film 103, and the data signal line S is formed on the etch-stop layer 105a and connected to the IGZO film 104c through a contact hole provided in the etch-stop layer 105a. Accordingly, when the IGZO film 104c is conductive, the scanning signal line G and the data signal line S are electrically connected via the IGZO film 104c.

In FIG. 11(B), the scanning signal line G is connected to the IGZO film 104c by the connection line CL, which is formed in the course of the formation of the pixel electrode 109, via a contact hole provided through the gate insulating film 103, the etch-stop layer 105a, and the passivation film 108, and also a contact hole provided through the etch-stop layer 105a and the passivation film 108. The data signal line S is the same as in the case shown in FIG. 11(A). Accordingly, when the IGZO film 104c is conductive, the scanning signal line G and the data signal line S are electrically connected via the IGZO film 104c and the connection line CL.

As such, in either of the coupling lines 213, the data signal line S and the scanning signal line G are not directly connected, and at least the IGZO film 104c is positioned therebetween. Accordingly, when the IGZO film 104c is a conductor, the data signal line S and the scanning signal line G are electrically connected via the IGZO film 104c. However, the coupling line 213 is not provided with any electrically conductive line that can take the place of the IGZO film 104c, and therefore, when the IGZO film 104c is a semiconductor, the data signal line $S_a$ and the scanning signal line G are electrically insulated. Moreover, as can be appreciated from FIG. 11, the IGZO film 104c rendered conductive is positioned between the silicon oxide films, which are formed in contact with top and bottom surfaces of the IGZO film 104c. Accordingly, the IGZO film 104c is rendered conductive by the conductivity induction treatment and also rendered semiconductive by the semiconductivity induction heat treatment.

It should be noted that when the coupling line 213 in FIG. 11(A) is viewed in a top view, even if all of the data signal line S, the scanning signal line G, and the IGZO film 104c simultaneously overlap one another, the data signal line S and the scanning signal line G are insulated by the IGZO film 104c so long as the IGZO film 104c is semiconductive, and therefore, no current flows between the data signal line S and the scanning signal line G. However, when a voltage is applied to each of the data signal line S and the scanning signal line G, the IGZO film 104c might conversely be rendered conductive. When the IGZO film 104c is rendered conductive, the data signal line S and the scanning signal line G are electrically connected via the IGZO film 104c, and a current flows between the data signal line S and the scanning signal line G. As a result, the liquid crystal display device fails to operate normally. Therefore, the data signal line S, the scanning signal line G, and the IGZO film 104c are formed so as not to simultaneously overlap one another when viewed in a plan view. Thus, the data signal line S and the scanning signal line G are not electrically connected, whereby any current is prevented from flowing therebetween. The foregoing also applies to the coupling line 213 shown in FIG. 11(B).

<2.5 Panel Inspection Circuit>

Next, the panel inspection circuit 260 will be described. Provided above the display portion 25 shown in FIG. 7 are lines 241 to 245, which are connected to respective ends of the data signal lines $S_1$ to $S_5$, and TFTs 240, which are respectively connected to the lines 241 to 245. Of the lines 241 to 245 connected to the TFTs 240, the even-numbered lines 242 and 244 are connected to a line $SS_2$, and the odd-numbered lines 241, 243, and 245 are connected to a line $SS_1$. As for gate electrodes of the TFTs 240, the gate electrodes of the TFTs 240 connected to the even-numbered lines 242 and 244 are connected by a line $SG_2$, and the gate electrodes of the TFTs 240 connected to the odd-numbered lines 241, 243, and 245 are connected by a line $SG_1$.

Similarly, provided to the left of the display portion 25 are lines 231 to 234, which are connected to respective ends of the scanning signal lines $G_1$ to $G_4$, and TFTs 230, which are respectively connected to the lines 231 to 234. Of the lines 231 to 234 connected to the TFTs 230, the even-numbered lines 232 and 234 are connected to a line $GS_2$, and the odd-numbered lines 231 and 233 are connected to a line $GS_1$. As for gate electrodes of the TFTs 230, the gate electrodes of the TFTs 230 connected to the even-numbered lines 232 and 234 are connected to a line $GG_2$, and the gate electrodes of the TFTs 230 connected to the odd-numbered lines 231 and 233 are connected to a line $GG_1$.

Therefore, for example, by applying a high-level voltage to the line $GG_2$ while applying a voltage to the lines 232 and 234 connected to the even-numbered scanning signal lines $G_2$ and $G_4$, the TFTs 230 connected to the even-numbered scanning signal lines $G_2$ and $G_4$ are turned on, whereby a predetermined voltage is applied to all of the data signal lines $S_1$ to $S_5$, in a manner as described in detail in relation to the basic study. In this case, only the pixel forming portions 100 that are connected to the even-numbered scanning signal lines $G_2$ and $G_4$ should be lit up by the predetermined voltage being written thereto. However, if some of the pixel forming portions 100 connected to the odd-numbered scanning signal lines $G_1$, $G_3$, and $G_5$ are lit up at the same time, it is appreciated that there is a short circuit at least between any one of the odd-numbered scanning signal lines $G_1$, $G_3$, and $G_5$ connected to the pixel forming portions 100 that are being lit up and any one of the even-numbered scanning signal lines $G_2$ and $G_4$ adjacent to that scanning signal line.

Similarly, for example, by applying a high-level voltage to the gate electrodes of the TFTs 230 connected to the scanning signal lines $G_1$ to $G_4$ and a predetermined voltage to the even-numbered data signal lines $S_2$ and $S_4$, it is possible to inspect whether there is a short circuit between any one of the even-numbered data signal lines $S_2$ and $S_4$ and any one of the odd-numbered data signal lines $S_1$, $S_3$, and $S_5$ adjacent to that data signal line.

Furthermore, a predetermined voltage may be applied to all of the data signal lines $S_1$ to $S_5$ by applying a voltage to the odd-numbered scanning signal lines $G_1$ and $G_3$, or a predetermined voltage may be applied to all of the scanning signal lines $G_1$ to $G_4$ by applying a voltage to the odd-numbered data signal lines $S_1$ and $S_3$.

In the foregoing description, both the lines 231 to 234 and the lines 241 to 245 of the panel inspection circuit 260 are divided into two groups, i.e., even-numbered and odd-numbered, and a panel inspection is performed with the lines connected within each group. However, this is not limiting, and the lines may be divided into three or more groups so as to perform a panel inspection with the lines connected within each group.

As shown in FIG. 7, the scanning signal lines $G_1$ to $G_4$ extend further to the left to be connected to the scanning signal line driver circuit 30, and the data signal lines $S_1$ to $S_5$ extend further to the top to be connected to the data signal line driver circuit 40. Accordingly, even without severing the panel inspection circuit 260 from the liquid crystal panel 20 after completion of the panel inspection, it is possible to connect the scanning signal lines $G_1$ to $G_4$ to respective output terminals of the scanning signal line driver circuit 30 and the data signal lines $S_1$ to $S_5$ to respective output terminals of the data signal line driver circuit 40 during steps of mounting the scanning signal line driver circuit 30 and the data signal line driver circuit 40, which will be described later.

Unlike in the case of the liquid crystal display device described in relation to the basic study, it is not only possible to perform a panel inspection without severing the electrostatic discharge prevention circuit 250 from the liquid crystal panel 20, as described above, but also possible to complete the liquid crystal display device 10 with the electrostatic discharge prevention circuit 250 and the panel inspection circuit 260 left unsevered around the display portion 25 after the panel inspection. Thus, there is no need for steps of severing the electrostatic discharge prevention circuit 250 and the panel inspection circuit 260 from the liquid crystal panel 20, whereby the cost of manufacturing the liquid crystal display device 10 can be reduced.

It should be noted that the panel inspection circuit 260 will also be referred to as the "display portion inspection circuit". Moreover, the TFT 230 will also be referred to as the "first thin-film transistor", and the TFT 240 will also be referred to as the "second thin-film transistor". The lines 231 to 234 connected to the scanning signal lines $G_1$ to $G_4$ will also be referred to as the "first lines", and the lines 241 to 245 connected to the data signal lines $S_1$ to $S_5$ will also be referred to as the "second lines". Furthermore, a portion of the panel inspection circuit 260 which is intended to apply a voltage to the scanning signal lines $G_1$ to $G_4$ will also be referred to as a "first inspection control portion", and another portion intended to apply a voltage to the data signal lines $S_1$ to $S_5$ will also be referred to as a "second inspection control portion".

<2.6 Structures of the TFTs in the Panel Inspection Portion>

FIG. 12 provides cross-sectional views illustrating the structures of the TFTs 230 and 240 used in the panel inspection circuit 260; more specifically, FIG. 12(A) is a cross-sectional view illustrating the structure of the TFT 240, which is of a bottom-gate type and connected to the line 241 extending from the data signal line $S_1$, and FIG. 12(B) is a cross-sectional view illustrating the structure of the TFT 230, which is of a top-gate type and connected to the lines 231 extending from the scanning signal line $G_1$.

The TFT 240 connected to the line 241 of the panel inspection circuit 260 is a bottom-gate TFT, as shown in FIG. 12(A). The line 241, which is formed simultaneously with the data signal lines, is connected at both terminals to the IGZO film 104c, which serves as a channel layer 104, through contact holes provided in the etch-stop layer 105a. Since the panel inspection is performed after the IGZO film is subjected to the semiconductivity induction heat treatment, the IGZO film is semiconductive. Therefore, the TFT 240 functions as a transistor controllable through the gate electrode 102. The foregoing also applies to the TFTs 240 connected to the other lines 242 to 245.

In the TFT 230 connected to the lines 231 of the panel inspection circuit 260, as shown in FIG. 12(B), the line 231 that serves as a source electrode and the line 231 that serves as a drain electrode are lines formed on the insulating substrate 101 and connected to the IGZO film 104c, which serves as a channel layer, via respective contact holes provided in the gate insulating film 103. Moreover, the line $GG_1$, which is formed on the etch-stop layer 105a simultaneously with the data signal lines S, overlies the IGZO film 104c and functions as a gate electrode, and therefore, the TFT 230 serves as a top-gate TFT. Since the panel inspection is performed after the IGZO film is subjected to the semiconductivity induction heat treatment, the TFT 230 functions as a transistor with the line $GG_1$ serving as a gate electrode.

FIG. 13 provides views illustrating the bottom-gate TFT connected to a line 231 of the panel inspection circuit 260; more specifically, FIG. 13(A) is a cross-sectional view of the bottom-gate TFT 230 connected to the line 231, FIG. 13(B) is a cross-sectional view illustrating a structure in which the scanning signal line $G_1$ is joined to a line 271 formed simultaneously with the data signal lines, so as to obtain the TFT 230 shown in FIG. 13(A), and FIG. 13(C) is a cross-sectional view illustrating another structure in which the scanning signal line $G_1$ is joined to a line 271 formed simultaneously with the data signal lines, so as to obtain the TFT 230 shown in FIG. 13(A).

The TFT 230 connected to the lines 231 of the panel inspection circuit 260 is a bottom-gate TFT and has the gate electrode 102 formed on the insulating substrate 101, as shown in FIG. 13(A). The line 271 that serves as a source electrode and the line 271 that serves as a drain electrode are formed simultaneously with the data signal lines and connected to the IGZO film 104c through respective contact holes provided in the etch-stop layer 105a. The TFT 230 is a TFT intended to inspect whether there is any short circuit along the scanning signal line $G_1$, and therefore, the lines 271 are required to be connected to the lines 231 connected to the scanning signal line $G_1$. The connections will be described next. The foregoing also applies to the TFTs 230 connected to the other lines 232 to 234.

In the TFT 230 shown in FIG. 13(A), the line 271, which is formed simultaneously with the data signal lines, is connected to a line 272, which is formed simultaneously with the pixel electrodes, via a contact hole provided in the passivation film 108, as shown in FIG. 13(B). Moreover, the line 272 is connected to the line 231, which is formed simultaneously with the scanning signal line $G_1$, via a contact hole provided through the passivation film 108, the etch-stop layer 105a, and the gate insulating film 103. Alternatively, the line 271 of the TFT 230 shown in FIG. 13(A) may be directly connected to the line 231 extending from the scanning signal line, through a contact hole provided through the etch-stop layer 105a and the gate insulating film 103, as shown in FIG. 13(C). In either case, the line 231 extending from the scanning signal line $G_1$ is connected to the line 271 formed simultaneously with the data signal lines, and therefore, the bottom-gate TFT 230 can be formed with the line 231 extending from the scanning signal line $G_1$. Accordingly, as in the case of the TFT 230 described in conjunction with FIG. 12(B), the bottom-gate TFT 230 shown in FIG. 13(A) can be used to inspect whether there is any short circuit caused along the scanning signal line $G_1$. The foregoing also applies to the TFTs 230 connected to the other lines 232 to 234.

<2.7 Method for Manufacturing the Liquid Crystal Display Device>

Figure 14:
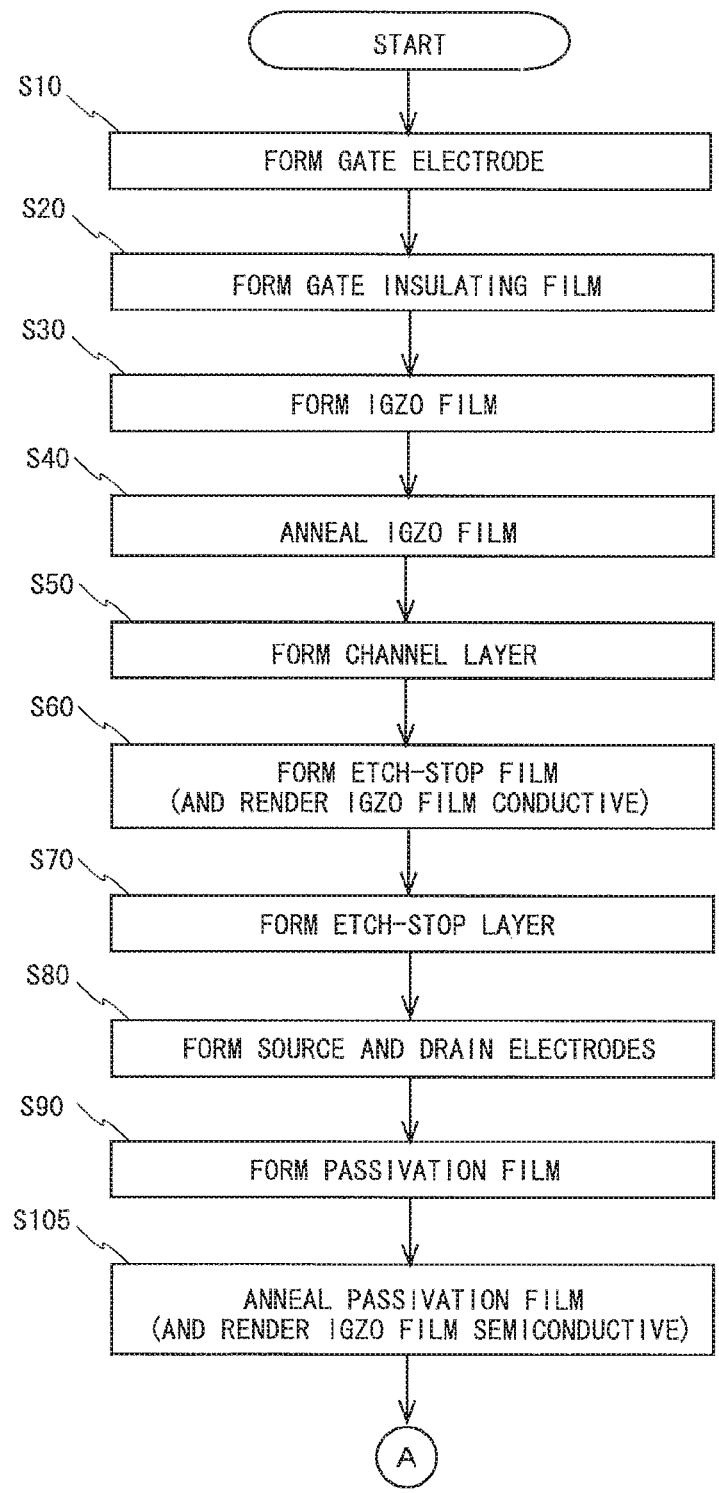
FIG. 14 is a flowchart showing a first portion of a process of manufacturing the liquid crystal display device according to the first embodiment.
Figure 15:
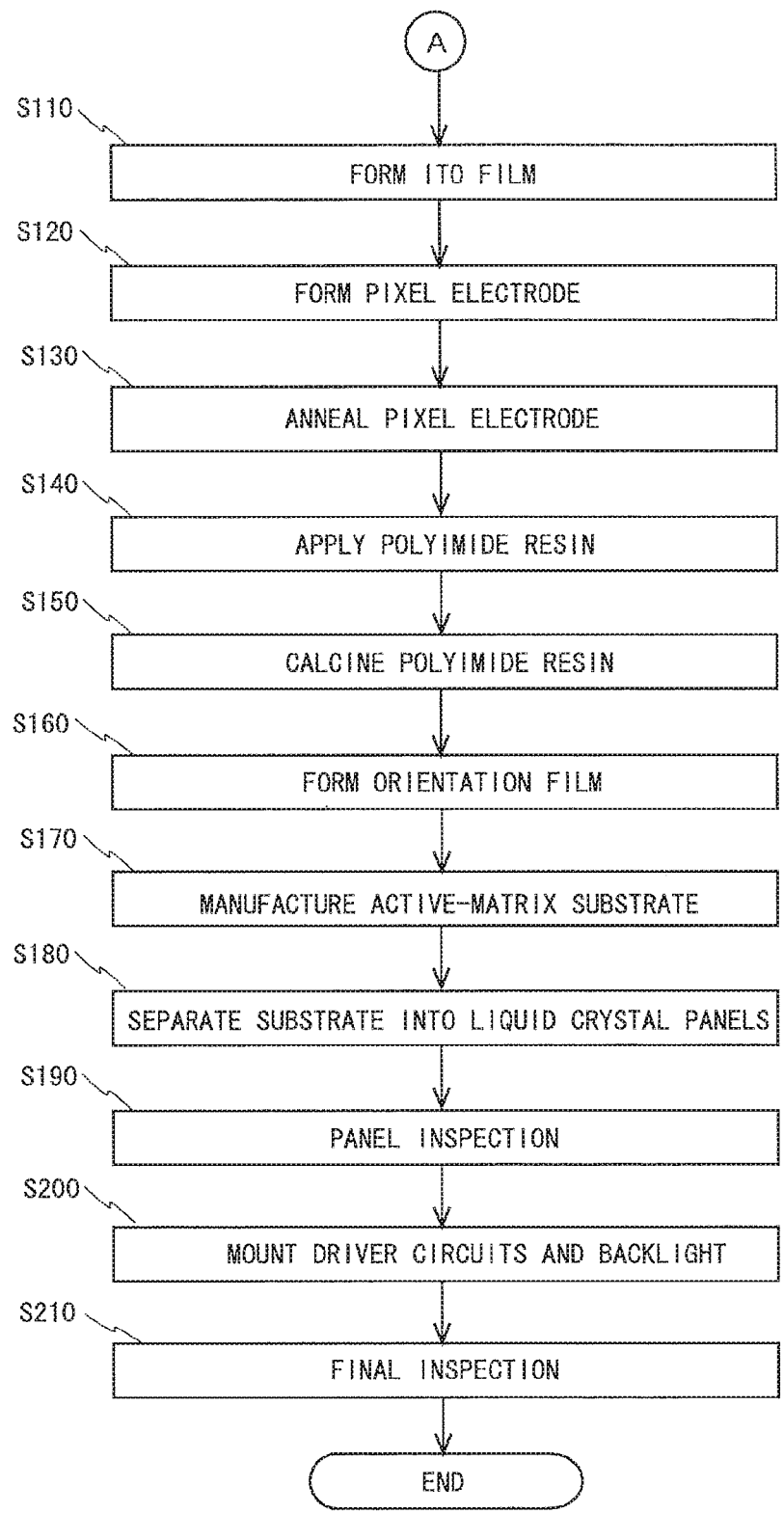
FIG. 15 is a flowchart showing a second portion of the manufacturing process shown in FIG. 14.
Figure 16:
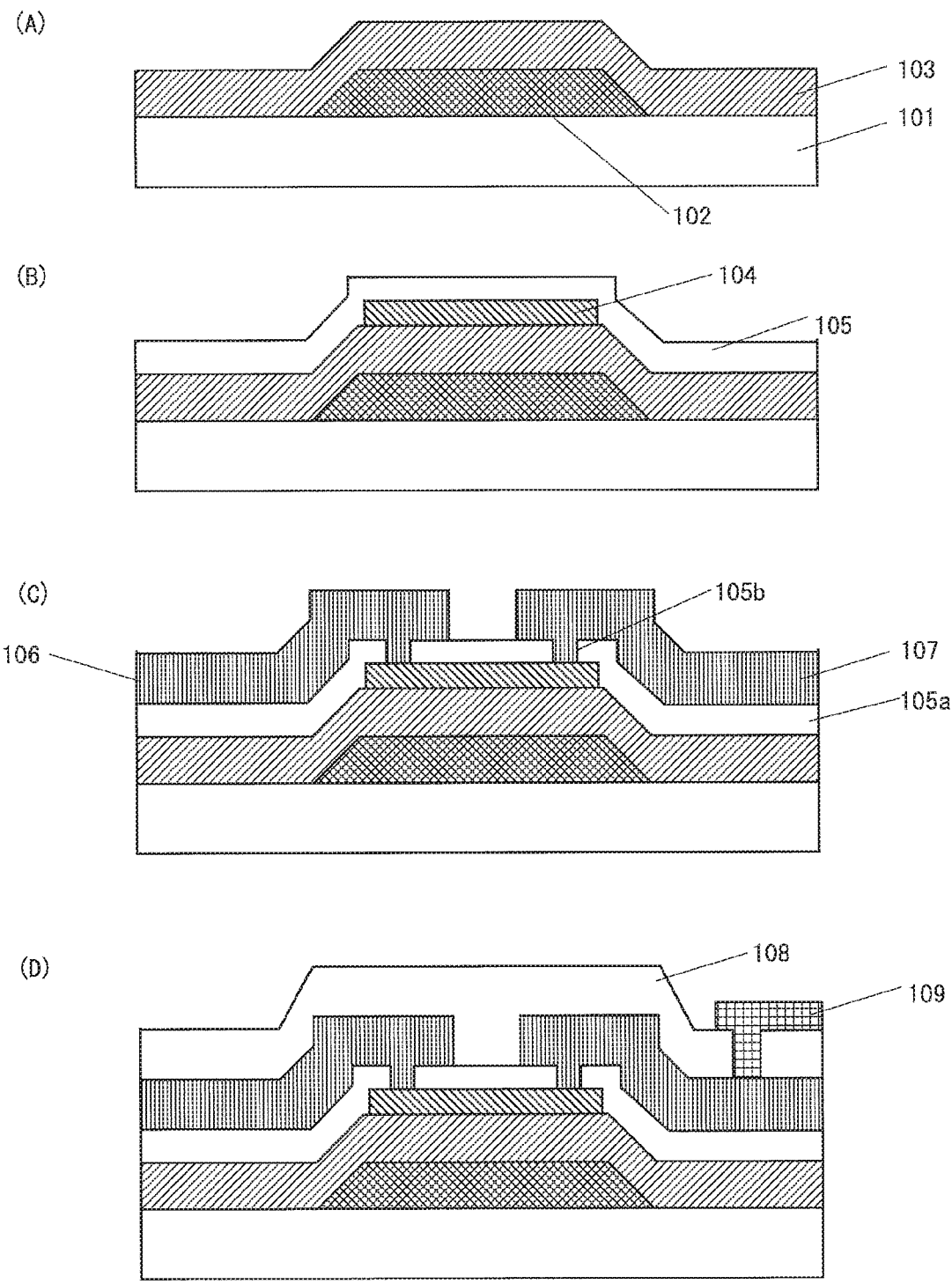
FIGS. 16(A) to 16(D) are cross-sectional views illustrating a process of producing the TFT shown in FIG. 6.

FIGS. 14 and 15 provide a flowchart showing the process of manufacturing the liquid crystal display device 10 according to the first embodiment, and FIGS. 16(A) to 16(D) are cross-sectional views illustrating the process of producing the TFT 110 shown in FIG. 6. Referring to FIGS. 14, 15, and 16(A) to FIG. 16(D), the method for manufacturing the liquid crystal display device 10, along with the TFT 110 formed in the liquid crystal display device 10, will be described.

As shown in FIG. 14, at step S10, a film stack of, for example, an aluminum film (Al) and a molybdenum film (Mo) thereon, is formed on an insulating substrate 101 such as a glass substrate. Next, the film stack is patterned using a resist pattern, which is formed by photolithography, as a mask, thereby forming a gate electrode 102 (see FIG. 16(A)). At step S20, a gate insulating film 103 is formed so as to cover the gate electrode 102. The gate insulating film 103 is a film stack obtained, for example, by forming a silicon oxide film on a silicon nitride film (SiNx).

At step S30, an IGZO film is formed by sputtering. At step S40, the IGZO film is annealed. The annealing is intended to improve characteristics of the TFT 110. At step S50, the IGZO film is etched using a resist pattern, which is formed by photolithography, as a mask, thereby forming a channel layer 104. As a result, the channel layer 104 made of the IGZO film is formed on the silicon oxide film included in the gate insulating film 103.

At step S60, by plasma CVD (chemical vapor deposition), an etch-stop film 105, which is made of a silicon oxide film, is formed on the channel layer 104 (see FIG. 15(B)). At this time, to form the etch-stop film, the insulating substrate 101 with the IGZO film formed thereon is heated in a vacuum at 200 to 300° C., more preferably, at 250° C. In this case, the IGZO film is rendered conductive by being heated without a surface covered with the silicon oxide film. Note that heating the substrate in the step of forming the etch-stop film 105 is an example of rendering the IGZO film conductive, and the IGZO film may be rendered conductive by a heat treatment or a plasma treatment in another step, as described earlier.

At step S70, the etch-stop film 105 made of silicon oxide is etched using a resist pattern, which is formed by photolithography, as a mask, thereby forming an etch-stop layer 105a. At this time, contact holes 105b for electrically connecting a source electrode 106 and a drain electrode 107, which are formed at a step to be described later, to the channel layer 104 are also provided in the etch-stop layer 105a. In addition, contact holes for connecting coupling lines 211 to 213 to the IGZO film are provided as well.

At step S80, a film stack is formed by stacking a titanium film (Ti), an aluminum film (Al), and a molybdenum film (Mo) in this order, and etched using a resist pattern, which is formed by photolithography, as a mask, thereby forming the source electrode 106 and the drain electrode 107 (see FIG. 15(C)). At this time, the source electrode 106 and the drain electrode 107 are electrically connected to the channel layer 104 respectively through two contact holes 105b provided in the etch-stop layer 105a. Simultaneously, a coupling conductor line 320 is connected to the IGZO film in each of the coupling lines 211 to 213.

At step S90, a passivation film 108 is formed by plasma CVD so as to cover the source electrode 106, the drain electrode 107, and the etch-stop layer 105a. The passivation film 108 is a film stack of, for example, a silicon oxide film and a silicon nitride film formed thereon.

At step S105, the passivation film 108 is annealed. At this time, the IGZO film is positioned between the silicon oxide film in the gate insulating film 103 and the silicon oxide film that constitutes the etch-stop layer 105a. The annealing is a semiconductivity induction heat treatment for stabilizing the passivation film 108 and hence electrical characteristics of the TFT 110 in each pixel forming portion 100, and also changing the IGZO film from a conductor to a semiconductor. The annealing is performed at a temperature of from 200° C. to 350° C., with the IGZO film positioned between the silicon oxide film that constitutes the gate insulating film and the silicon oxide film that constitutes the etch-stop layer 105a. The reason for setting such an annealing temperature is that when the passivation film 108 is annealed at a temperature lower than 200° C. or at a temperature higher than 350° C., the IGZO film remains a conductor without being changed into a semiconductor.

The annealing of the passivation film 108 changes the IGZO film from a conductor to a semiconductor, so that the electrical characteristics of the TFT 110 in the pixel forming portion 100 can be measured. Accordingly, even during the process of manufacturing a liquid crystal panel 20, whether the process so far has been carried out properly can be checked by measuring the electrical characteristics of the TFTs 110. Moreover, the IGZO film in each coupling line is changed into a semiconductor, and therefore, the coupling lines 211 to 213 are rendered in OFF state. As a result, scanning signal lines $G_1$ to $G_n$ and data signal lines $S_1$ to $S_m$, which are coupled by the coupling lines 211 to 213, are electrically isolated from each other. At this time, IGZO films in channel layers of TFTs 230 and 240 in a panel inspection circuit 260 are also changed into semiconductors, whereby the liquid crystal panel 20 to be described later can be inspected.

It should be noted that since the annealing of the passivation film 108 changes the IGZO films included in the coupling lines 211 to 213 from conductors to semiconductors, it is not possible to suppress the occurrence of ESD if the signal lines are electrostatically charged during subsequent steps. However, it is less likely for the signal lines to be electrostatically charged during subsequent steps, and therefore, even if the IGZO films are rendered semiconductive during the current step, almost no significant influence is caused.

At step S110, a film of ITO, which is transparent metal, is formed by sputtering. At step S120, the ITO film is wet etched using a resist pattern, which is formed by photolithography, as a mask, thereby forming a pixel electrode 109 (see FIG. 15(D)). Note that the ITO film is amorphous immediately after the formation and therefore is readily patterned by wet etching. However, to allow the ITO film to function as a transparent electrode, the ITO film needs to be crystallized. Accordingly, at step S130, annealing is performed to crystallize the pixel electrode 109. The annealing temperature is lower than 200° C., and therefore, the IGZO films having been changed into semiconductors are not influenced.

At step S140, a polyimide resin dissolved in a solvent is applied to the pixel forming portion 100, and at step S150, the applied polyimide resin is calcined, thereby forming a polyimide film. The calcining temperature is 100 to 200° C., and therefore, the IGZO films having been changed into semiconductors are not influenced.

At step S160, the polyimide film is etched using a resist pattern, which is formed by photolithography, as a mask, thereby forming an orientation film, and further, a surface of the orientation film is rubbed in order that liquid crystal molecules are oriented in the same direction when no voltage is applied to a liquid crystal layer. As a result, a TFT substrate is completed.

At step S170, a color filter substrate, which is produced by a process different from the production process of the TFT substrate, is placed and bonded on the TFT substrate under pressure, thereby manufacturing an active-matrix substrate. Next, liquid crystal is injected into a gap between the TFT substrate and the color filter substrate, thereby sealing the gap. At step S180, the liquid crystal panel 20 is cut out from the active-matrix substrate, and polarizing plates are affixed to top and bottom surfaces of the liquid crystal panel 20.

At step S190, the panel inspection circuit 260 is used to perform a panel inspection as to whether there is any short circuit between scanning signal lines, between data signal lines, and between the scanning signal lines and the data signal lines. At this time, since the IGZO films in the coupling lines 211 to 213 have been changed from conductors to semiconductors by the annealing at step S105, the scanning signal lines are electrically isolated from one another, the data signal lines are electrically isolated from one another, and the scanning signal lines and the data signal lines are electrically isolated from each other. Therefore, it is not necessary to sever an electrostatic discharge prevention circuit 250 from the liquid crystal panel 20 before the panel inspection at step S190. As described above, the panel inspection circuit 260 is used to inspect whether there is any short circuit between the signal lines formed in the liquid crystal panel 20.

When the panel inspection confirms that there is no short circuit, driver circuits, such as a scanning signal line driver circuit 30 and a data signal line driver circuit 40, and a backlight unit for backlighting the liquid crystal panel 20 are mounted in the liquid crystal panel 20 at step S200. At step S210, a final inspection, including tests for the driver circuit and the backlight unit mounted at step S200, are performed on the liquid crystal display device 10, thereby completing the manufacturing of the liquid crystal panel 20. In this manner, the liquid crystal panel 20 of the liquid crystal display device 10 according to the present embodiment is manufactured.

<2.8 Effects>

In the present embodiment, the scanning signal lines $G_1$ to $G_4$ and the data signal lines $S_1$ to $S_5$ are coupled by the coupling conductor line 220. Since the coupling conductor line 220 includes the IGZO film 104c rendered conductive by the conductivity induction treatment, the scanning signal lines $G_1$ to $G_4$ and the data signal lines $S_1$ to $S_5$ are electrically connected to each other. Accordingly, even if some of the signal lines are electrostatically charged during the manufacturing process, the electrostatic charge moves through the coupling conductor line 220 to other signal lines, with the result that the scanning signal lines $G_1$ to $G_4$ and the data signal lines $S_1$ to $S_5$ have the same potential. Thus, the occurrence of ESD is suppressed.

Furthermore, when steps in which static electricity is likely to occur are completed during the manufacturing process, the IGZO film 104c, which is positioned between the silicon oxide film included in the gate insulating film 103 and the etch-stop layer 105a made of the silicon oxide film, is annealed at a temperature of from 200° C. to 350° C. after the passivation film 108 is formed. Accordingly, the IGZO film 104c is changed from a conductor to a semiconductor, and further, since there is no line that takes the place of the IGZO film 104c, the scanning signal lines $G_1$ to $G_4$ and the data signal lines $S_1$ to $S_5$ are electrically insulated from each other. Consequently, there is no need to sever the electrostatic discharge prevention circuit 250 from the liquid crystal panel 20, so that the cost of manufacturing the liquid crystal display device 10 can be reduced.

Furthermore, the panel inspection circuit 260 is disposed outside the display portion 25 in order to inspect whether there is any short circuit between the scanning signal lines $G_1$ to $G_4$, between the data signal lines $S_1$ to $S_5$, or between the scanning signal lines $G_1$ to $G_4$ and the data signal lines $S_1$ to $S_5$. In this case, since the lines 231 to 234 are connected to the scanning signal lines $G_1$ to $G_4$ in the panel inspection circuit 260 and the lines 241 to 245 are connected to the data signal lines $S_1$ to $S_5$, for example, by applying voltages respectively to all of the lines 231, 233, and 241 to 245 and then observing the lighting status of the pixel forming portions 100, it is possible to find out whether there is any short circuit between the lines. Moreover, the liquid crystal display device 10 operates even if the panel inspection circuit 260 is not severed from the liquid crystal panel 20 upon completion of the inspection of the display portion 25. In this manner, the need for the step of severing the panel inspection circuit 260 is eliminated, so that the cost of manufacturing the liquid crystal display device 10 can be reduced.

<2.9 Variants>

In the embodiment, all of the scanning signal lines $G_1$ to $G_4$ and the data signal lines $S_1$ to $S_5$ have been described as being connected by the coupling conductor line 220 alone. However, only the scanning signal lines $G_1$ to $G_4$ or the data signal lines $S_1$ to $S_5$ may be coupled by the coupling conductor line. Alternatively, the scanning signal lines $G_1$ to $G_4$ may be coupled by a first coupling conductor line, and the data signal lines $S_1$ to $S_5$ may be coupled by a second coupling conductor line, so that the scanning signal lines $G_1$ to $G_4$ and the data signal lines $S_1$ to $S_5$ are not coupled to each other. As a result, the scanning signal lines $G_1$ to $G_4$ have the same potential, whereby it is rendered possible to prevent a short circuit between the scanning signal lines $G_1$ to $G_4$. Similarly, the data signal lines $S_1$ to $S_5$ have the same potential, whereby it is rendered possible to prevent a short circuit between the data signal lines $S_1$ to $S_5$.

3. Second Embodiment

The configuration of a liquid crystal display device according to a second embodiment of the present invention and the configurations of an electrostatic discharge prevention circuit and a panel inspection circuit provided in the liquid crystal display device are the same as, respectively, the configuration of the liquid crystal display device 10 according to the first embodiment and the configurations of the electrostatic discharge prevention circuit 250 and the panel inspection circuit 260 provided in the liquid crystal display device 10, and therefore, any descriptions thereof will be omitted.

Figure 17:
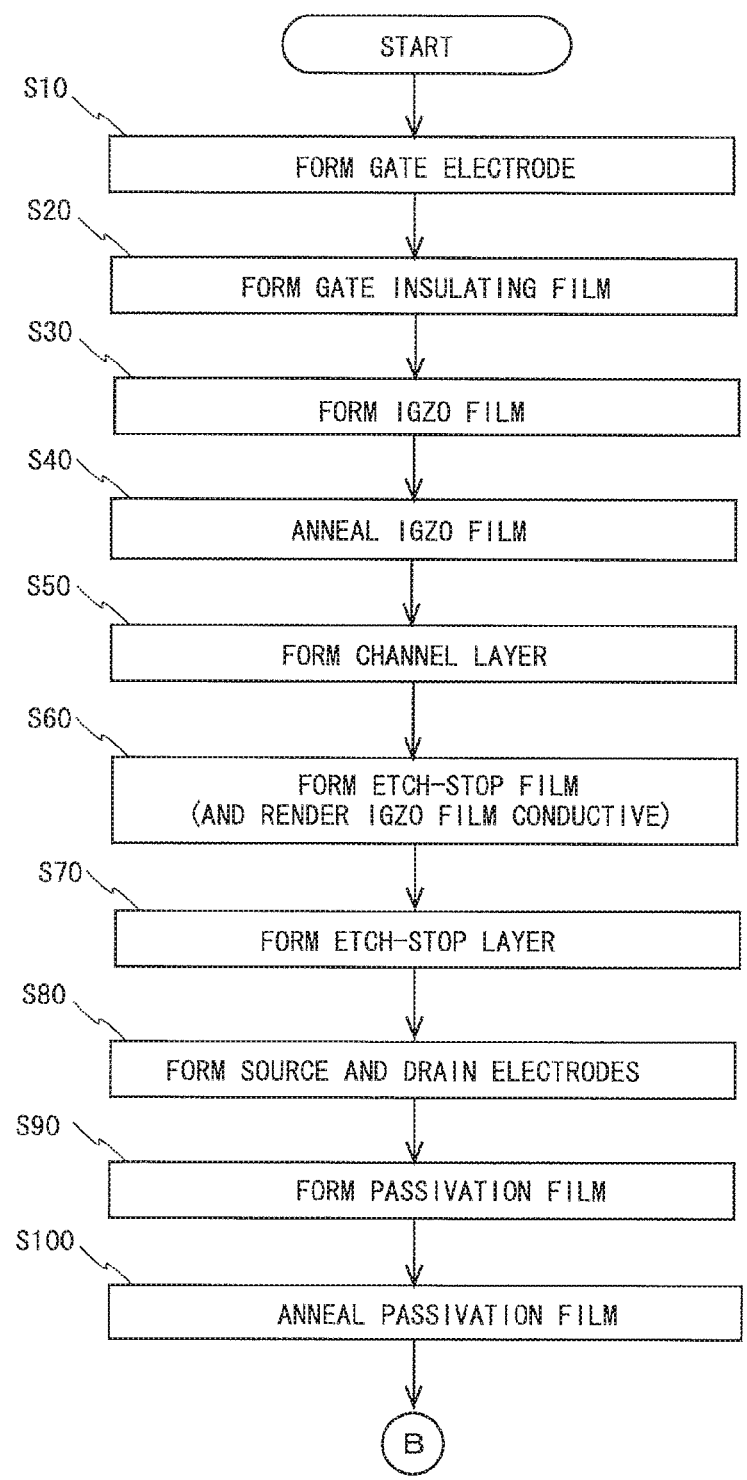
FIG. 17 is a flowchart showing a first portion of a process of manufacturing a liquid crystal display device according to a second embodiment of the present invention.
Figure 18:
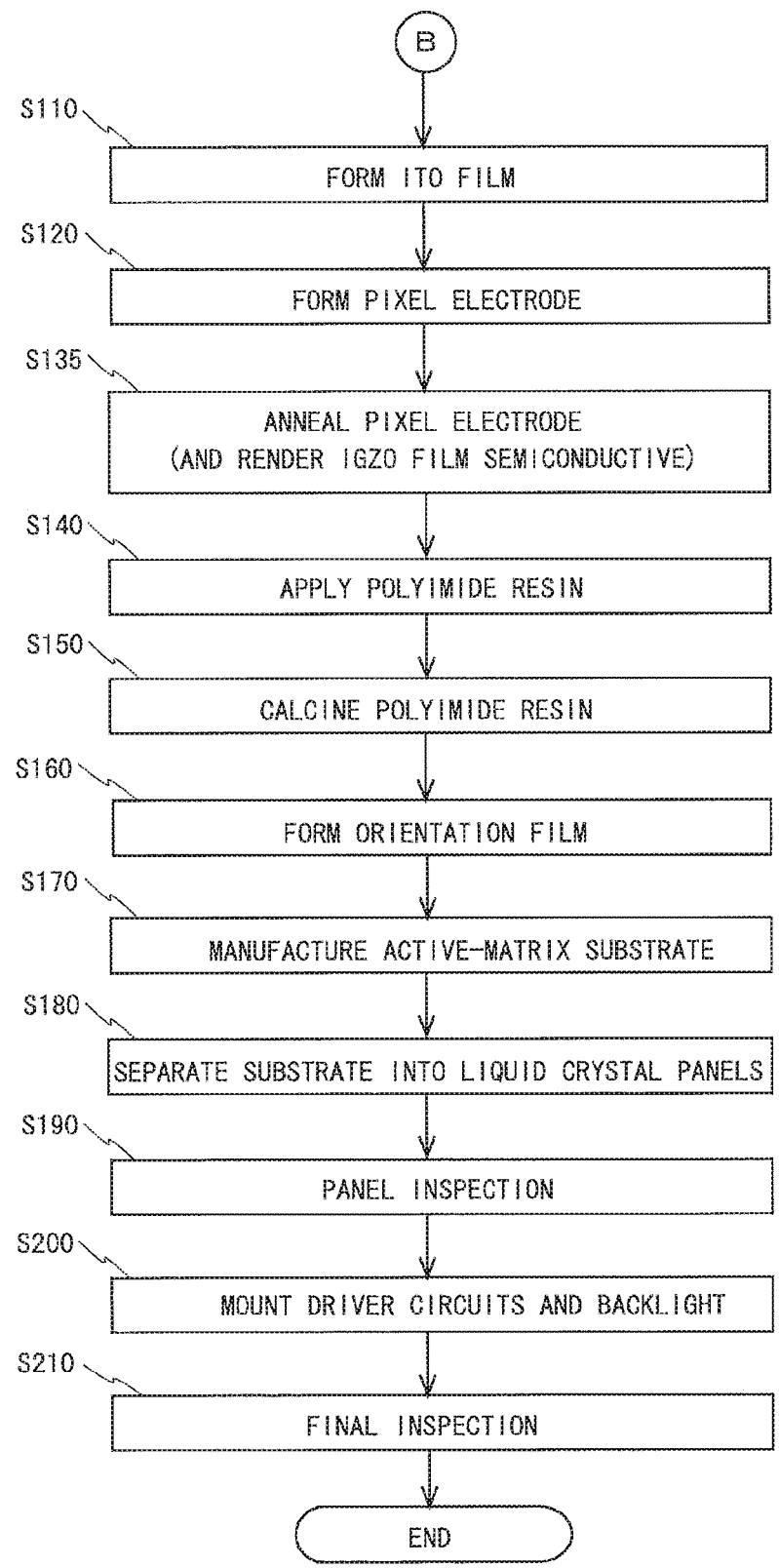
FIG. 18 is a flowchart showing a second portion of the manufacturing process shown in FIG. 17.

FIGS. 17 and 18 provide a flowchart showing the process of manufacturing the liquid crystal display device according to the second embodiment. In FIG. 17, the procedures from step S10 for forming the gate electrode 102 to step S100 for forming the passivation film 108 are the same as the procedures shown in the flowchart in FIG. 14 and illustrated in the cross-sectional views for the production process of the TFT 110 in FIGS. 16(A) to 16(D), and therefore, any descriptions thereof will be omitted.

After the passivation film 108 is formed at step S90, the passivation film 108 is annealed at step S100. Unlike at step S105 in FIG. 14, the annealing temperature is lower than 200° C., and therefore, the IGZO film that has been turned into a conductor at step S60 is not changed into a semiconductor. At step S110, an ITO film is formed by sputtering, and at step S120, the ITO film is wet etched using a resist pattern, which is formed by photolithography, as a mask, thereby forming a pixel electrode 109.

At step S135, the pixel electrode 109 is annealed. The annealing is performed at a temperature from 200° C. to 350° C. and in this regard differs from the annealing of the pixel electrode 109 at step S130 in FIG. 15. At this time, the IGZO film is positioned between the silicon oxide film included in the gate insulating film 103 and the silicon oxide film that constitutes the etch-stop layer 105a. The annealing crystallizes the ITO film that constitutes the pixel electrode 109, and also changes the IGZO film from a conductor to a semiconductor. Note that when the pixel electrode 109 is annealed at a temperature lower than 200° C. of a temperature higher than 350° C., the IGZO film remains a conductor without being rendered semiconductive.

The annealing of the pixel electrode 109 changes the IGZO film 104c from a conductor to a semiconductor, so that electrical characteristics of the TFT 110 can be measured. Accordingly, even during the process of manufacturing the liquid crystal panel 20, whether the process so far has been performed properly can be checked by measuring the electrical characteristics of the TFTs 110. Moreover, all of the coupling lines 211 to 213 are rendered in OFF state, so that the scanning signal lines $G_1$ to $G_n$ and the data signal lines $S_1$ to $S_m$, which are coupled by the coupling lines 211 to 213, are electrically isolated. At this time, the IGZO films in the channel layers of the TFTs 230 and 240 in the panel inspection circuit 260 are rendered semiconductive, whereby the TFTs are rendered operable, with the result that the liquid crystal panel 20 to be described later can be inspected.

It should be noted that since the annealing of the pixel electrode 109 changes the IGZO films 104c included in the coupling lines 211 to 213 from conductors to semiconductors, it is not possible to suppress the occurrence of ESD if electrostatic charge occurs during subsequent steps. However, when compared to the first embodiment, there is much less possibility that electrostatic charge might occur during subsequent steps, and therefore, even if the IGZO films 104c are changed into semiconductors during the current step, almost no significant influence is caused.

Thereafter, the procedures from step S140 for the polyimide resin application to step S210 for the final inspection are the same as the procedures in the first embodiment shown in FIG. 14 and FIG. 15, and therefore, any descriptions thereof will be omitted. In this manner, the liquid crystal panel 20 of the liquid crystal display device according to the present embodiment is manufactured.

<3.1 Effects>

In the present embodiment, the conductivity induction treatment for rendering the IGZO film 104c conductive is the same as in the first embodiment. However, the semiconductivity induction heat treatment for changing from a conductor to a semiconductor is performed at a temperature of from 200° C. to 350° C. after the pixel electrode 109 of the TFT 110 is formed. As a result, the ITO film of the pixel electrode 109 is crystallized, and further, the IGZO film 104c is changed from a conductor to a semiconductor. The step of annealing the pixel electrode 109 is performed after the annealing of the passivation film 108 as performed in the first embodiment, and therefore, when compared to the first embodiment, the occurrence of ESD can be further suppressed. Moreover, as in the first embodiment, the need to sever the coupling conductor line 220 from the liquid crystal panel 20 is eliminated, so that the cost of manufacturing the liquid crystal display device can be reduced.

4. Third Embodiment

The configuration of a liquid crystal display device according to a third embodiment of the present invention and the configurations of an electrostatic discharge prevention circuit and a panel inspection circuit provided in the liquid crystal display device are the same as, respectively, the configuration of the liquid crystal display device 10 according to the first embodiment and the configurations of the electrostatic discharge prevention circuit 250 and the panel inspection circuit 260 provided in the liquid crystal display device 10, and therefore, any descriptions thereof will be omitted.

Figure 19:
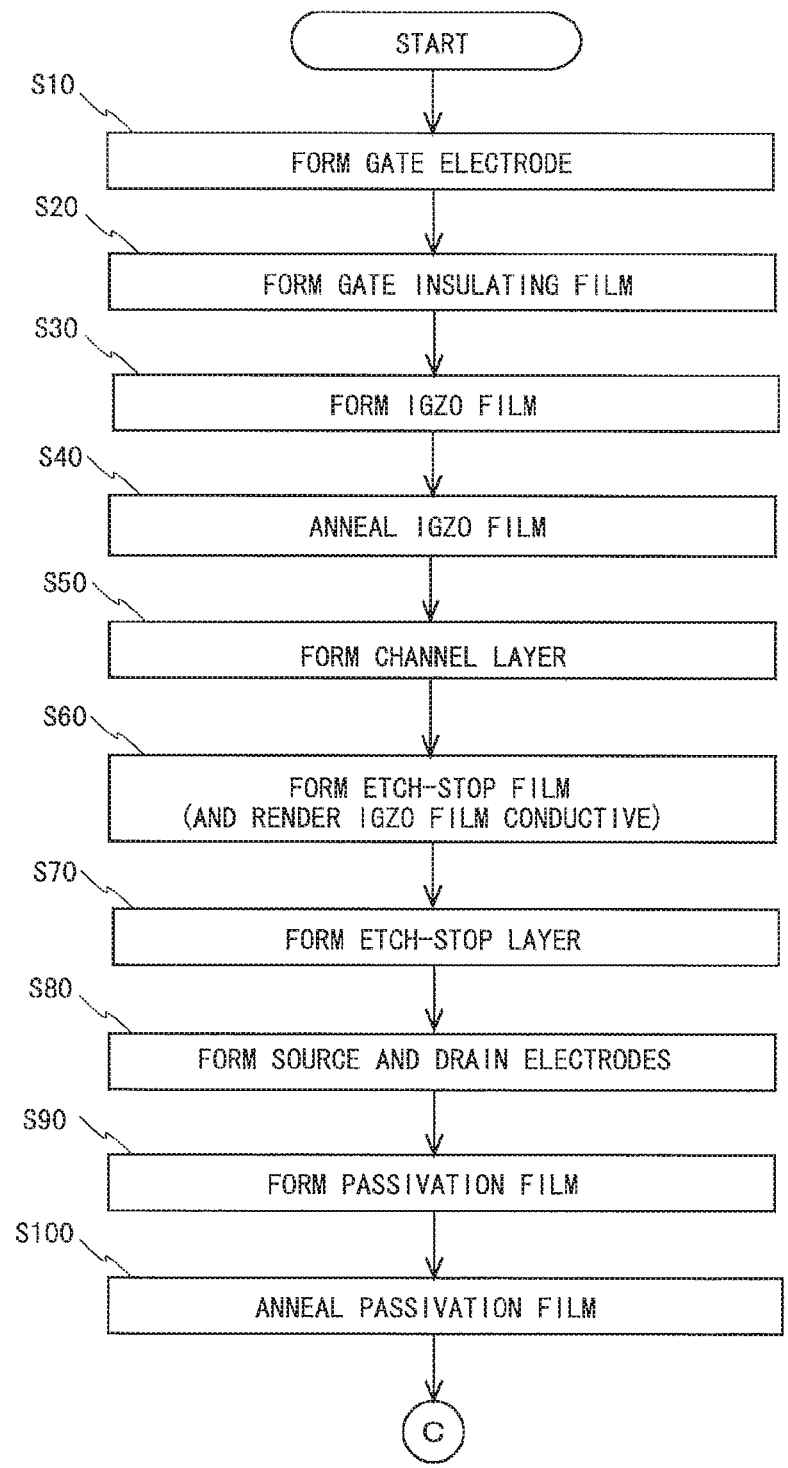
FIG. 19 is a flowchart showing a first portion of a process of manufacturing a liquid crystal display device according to a third embodiment of the present invention.
Figure 20:
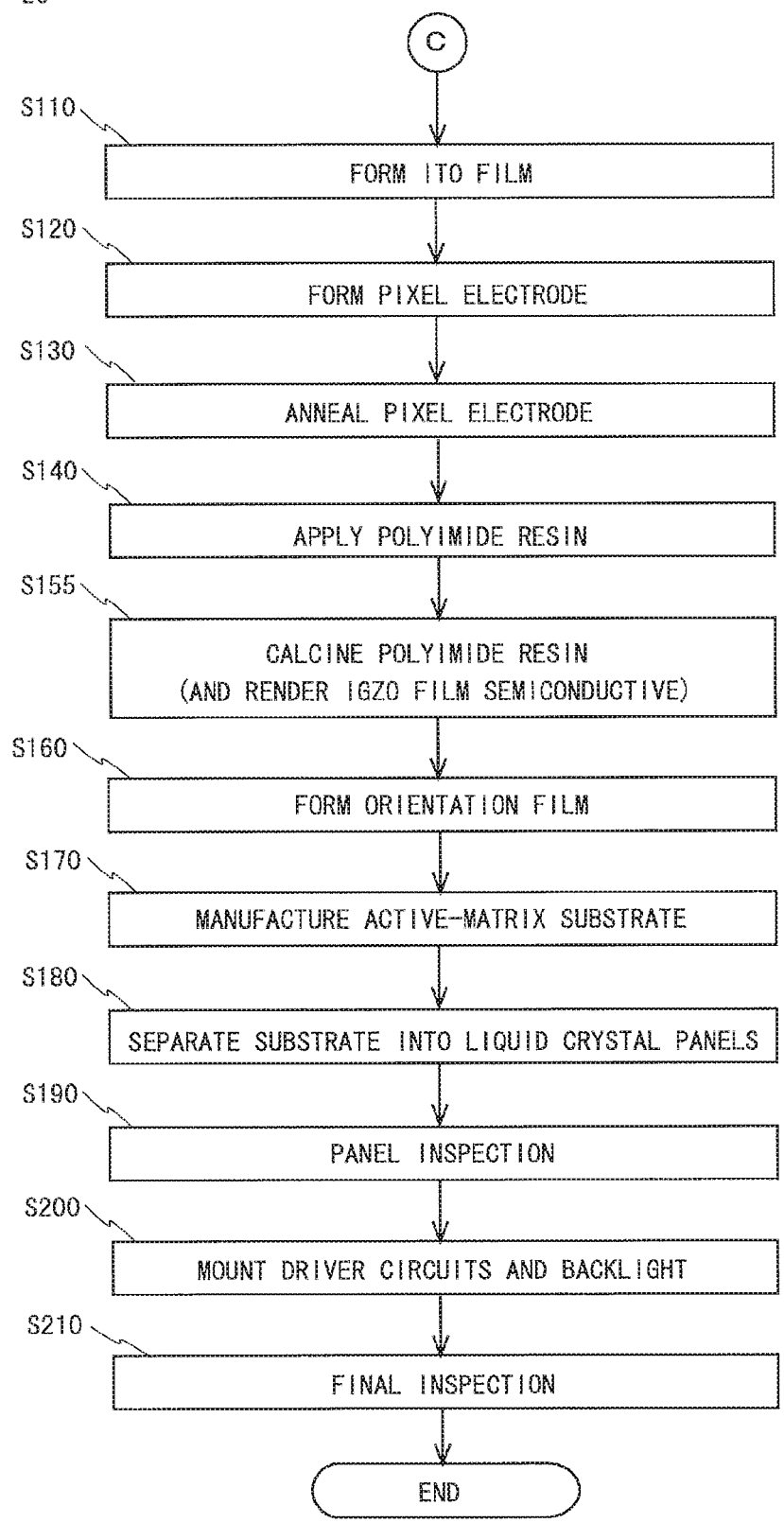
FIG. 20 is a flowchart showing a second portion of the process of manufacturing the liquid crystal display device according to the third embodiment of the present invention.

FIGS. 19 and 20 provide a flowchart showing the process of manufacturing the liquid crystal display device according to the third embodiment. In FIGS. 19 and 20, the procedures from step S10 forming the gate electrode 102 to step S140 for the polyimide film application are the same as the procedures shown in the flowchart in FIGS. 14 and 15 and illustrated in the cross-sectional views for the production process of the TFT 110 in FIGS. 16(A) to 16(D), and therefore, any descriptions thereof will be omitted.

After the polyimide resin is applied at step S140, the polyimide resin is calcined at step S155. Unlike the calcining of the polyimide resin at step S150 in FIG. 15, the calcining is performed at a temperature of from 200° C. to 350° C. At this time, the IGZO film is positioned between the silicon oxide film included in the gate insulating film 103 and the silicon oxide film that constitutes the etch-stop layer 105a. The calcining not only forms the polyimide film but also changes the IGZO film from a conductor to a semiconductor. Note that when the pixel electrode 109 is annealed at a temperature lower than 200° C. of a temperature higher than 350° C., the IGZO film remains a conductor without being rendered semiconductive.

The calcining of the polyimide resin changes the IGZO film 104c from a conductor to a semiconductor, so that electrical characteristics of the TFT can be measured. Accordingly, even during the process of manufacturing a liquid crystal panel 20, whether the process so far has been carried out properly can be checked by measuring the electrical characteristics of the TFTs 110. Moreover, all of the coupling lines 211 to 213 are rendered in OFF state, so that the scanning signal lines $G_1$ to $G_n$ and the data signal lines $S_1$ to $S_m$, which are connected to the coupling lines 211 to 213, are electrically isolated. At this time, the IGZO films 104c in the channel layers 104 of the TFTs 230 and 240 in the panel inspection circuit 260 are also changed from conductors to semiconductors, whereby the liquid crystal panel 20 to be described later can be inspected.

It should be noted that since the calcining of the polyimide resin changes the IGZO films 104c of the coupling lines 211 to 213 from conductors to semiconductors, it is not possible to prevent ESD from occurring if electrostatic charge occurs during subsequent steps. However, when compared to the first and second embodiments, there is much less possibility that electrostatic charge might occur during subsequent steps, and therefore, even if the IGZO films are rendered semiconductive during the current step, almost no significant influence is caused.

Thereafter, the procedures from step S160 for the orientation film formation to step S210 for the final inspection are the same as the procedures in the first embodiment shown in FIG. 14 and FIG. 15 and therefore, any descriptions thereof will be omitted.

<4.1 Effects>

In the present embodiment, the conductivity induction treatment for rendering the IGZO film 104c conductive is the same as in the first embodiment. However, the semiconductivity induction heat treatment for changing from a conductor to a semiconductor is performed at a temperature of from 200° C. to 350° C. when the orientation film provided in the pixel forming portion 100 is calcined. As a result, the orientation film of the pixel electrode 109 is crystallized, and further, the IGZO film 104c is changed from a conductor to a semiconductor. The step of calcining the orientation film is performed after the annealing of the pixel electrode 109 as performed in the second embodiment, and therefore, when compared to the second embodiment, the occurrence of ESD can be further suppressed. Moreover, as in the first and second embodiments, the need to sever the coupling conductor line 220 from the liquid crystal panel 20 is eliminated, so that the cost of manufacturing the liquid crystal display device can be reduced.

5. Fourth Embodiment

The configuration of a liquid crystal display device according to a fourth embodiment of the present invention and the configurations of an electrostatic discharge prevention circuit and a panel inspection circuit provided in the liquid crystal display device are the same as, respectively, the configuration of the liquid crystal display device 10 according to the first embodiment and the configurations of the electrostatic discharge prevention circuit 250 and the panel inspection circuit 260 provided in the liquid crystal display device 10, and therefore, any descriptions thereof will be omitted.

<5.1 Structure of the TFT>

Figure 21:
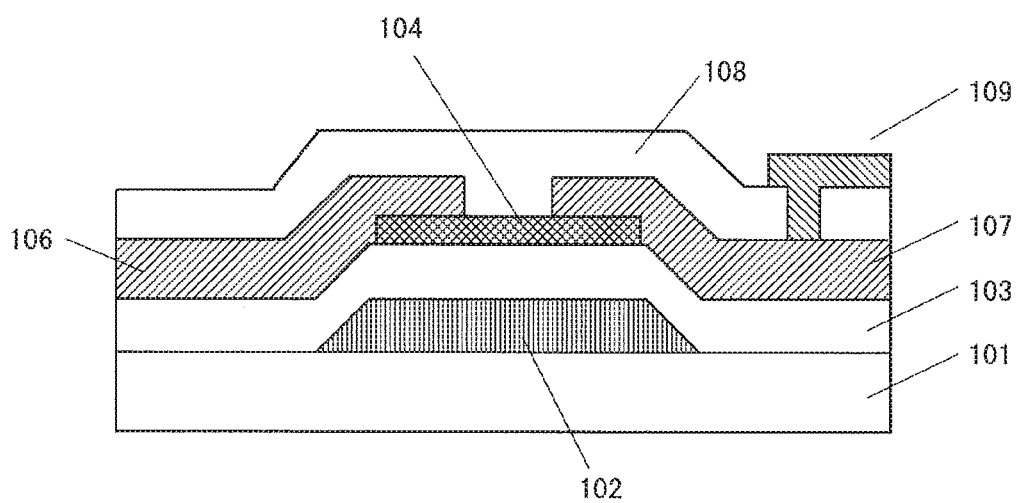
FIG. 21 is a view illustrating the structure of a channel-etched TFT.

In the preceding embodiments, the TFTs 110, 230, and 240 have been described as being of a channel-stop type. However, the TFTs 110, 230, and 240 may be of a channel-etched type. FIG. 21 is a cross-sectional view illustrating the structure of a channel-etched TFT. As shown in FIG. 21, the channel-etched TFT is structured by forming a gate electrode 102, a gate insulating film 103, a channel layer 104, which is made of an oxide semiconductor, a source electrode 106, and a drain electrode 107 on and above an insulating substrate 101 and also forming a passivation film 108 so as to cover these components. A portion of the channel layer 104 that overlies the gate electrode 102 functions as a channel region. The channel-etched TFT has no etch-stop layer formed on the channel region, and the source electrode 106 and the drain electrode 107 are disposed such that bottom surfaces of end portions on the channel region side are in contact with a top surface of the channel layer 104. The channel-etched TFT is formed, for example, by forming a conductive layer for the source electrode 106 and the drain electrode 107 on the channel layer 104 and separating the source electrode 106 and the drain electrode 107. In the course of separating the source electrode 106 and the drain electrode 107, the channel region might have a surface etched to a slight degree.

<5.2 Structures of the Coupling Lines in the Coupling Conductive Line>

The channel-etched TFT has no etch-stop layer formed therein. Accordingly, unlike the coupling lines 211 to 213 described in the first embodiment and shown in FIGS. 9 to 11, the coupling lines of the coupling conductor line 220 using the channel-etched TFTs and formed in the liquid crystal panel have no etch-stop layers formed therein. Therefore, the coupling lines 211 to 213 included in the coupling conductor line 220 using the channel-etched TFTs and formed in the liquid crystal panel will be described.

FIG. 22 provides cross-sectional views illustrating structures of the coupling lines 211 electrically connecting adjacent scanning signal lines; more specifically, FIG. 22(A) is a cross-sectional view illustrating a structure of the coupling line 211 in which scanning signal lines $G_a$ and $G_b$ are connected via the connection line CL and the IGZO film 104c, FIG. 22(B) is a cross-sectional view illustrating a structure of the coupling line 211 in which the scanning signal lines $G_a$ and $G_b$ are directly connected by the IGZO film 104c, and FIG. 22(C) is a cross-sectional view illustrating another structure of the coupling line 211 in which the scanning signal lines $G_a$ and $G_b$ are directly connected by the IGZO film 104c.

In the coupling line 211 shown in FIG. 22(A), the connection line CL is connected to the scanning signal lines $G_a$ and $G_b$ through respective contact holes provided in the gate insulating film 103. Moreover, the connection line CL is also connected to the IGZO film 104c formed on the gate insulating film 103. Thus, the scanning signal lines $G_a$ and $G_b$ formed on the insulating substrate 101 are connected via the connection line CL, which is formed simultaneously with the data signal lines, and the IGZO film 104c.

In the coupling line 211 shown in FIG. 22(B), the IGZO film 104c formed on the gate insulating film 103 is connected to the scanning signal lines $G_a$ and $G_b$ through respective contact holes provided in the gate insulating film 103. Thus, the scanning signal lines $G_a$ and $G_b$ formed on the insulating substrate 101 are connected simply via the IGZO film 104c.

In the coupling line 211 shown in FIG. 22(C), the IGZO film 104c is formed on the insulating substrate 101 and connected to each of the scanning signal lines $G_a$ and $G_b$. Thus, the scanning signal lines $G_a$ and $G_b$ formed on the insulating substrate 101 are connected simply via the IGZO film 104c.

In this manner, in any of the coupling lines 211, the scanning signal lines $G_a$ and $G_b$ are not directly connected, at least the IGZO film 104c is positioned therebetween, and therefore, when the IGZO film 104c is a conductor, the scanning signal lines $G_a$ and $G_b$ are electrically connected via the IGZO film 104c. However, the coupling line 211 is not provided with any electrically conductive conductor line that can take the place of the IGZO film 104c, and therefore, when the IGZO film 104c is a semiconductor, the scanning signal lines $G_a$ and $G_b$ are electrically insulated. Moreover, as can be appreciated from FIGS. 22(A) to 22(C), the IGZO film 104c rendered conductive is positioned between silicon oxide films, which are formed in contact with top and bottom surfaces of the IGZO film 104c. Accordingly, the IGZO film 104c is rendered conductive by performing the conductivity induction treatment and also semiconductive by performing the semiconductivity induction heat treatment.

Figure 23:
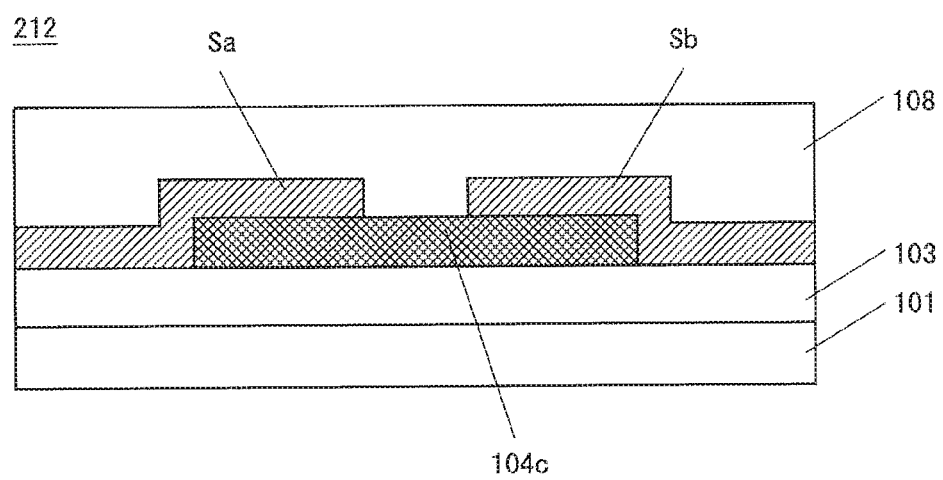
FIG. 23 is a cross-sectional view illustrating a structure of a coupling line connecting two adjacent data signal lines of the liquid crystal panel shown in FIG. 7, where a channel-etched TFT is used.

FIG. 23 is a cross-sectional view illustrating a structure of the coupling line 212 connecting adjacent data signal lines $S_a$ and $S_b$. As shown in FIG. 23, the data signal lines $S_a$ and $S_b$ are connected directly to end portions of a top surface of the IGZO film 104c formed on the gate insulating film 103.

In this manner, in the case of the coupling line 212 also, the data signal lines $S_1$ and $S_2$ are not directly connected, and the IGZO film 104c is positioned therebetween, so that when the IGZO film 104c is a conductor, the data signal lines $S_1$ and $S_2$ are electrically connected via the IGZO film 104c. However, the coupling line 212 is not provided with any electrically conductive line that can take the place of the IGZO film 104c, and therefore, when the IGZO film 104c is a semiconductor, it is ensured that the data signal lines $S_1$ and $S_2$ are electrically insulated. Moreover, as can be appreciated from FIG. 23, the IGZO film 104c rendered conductive is positioned between silicon oxide films, which are formed in contact with top and bottom surfaces of the IGZO film 104c. Accordingly, the IGZO film 104c is rendered conductive by performing the conductivity induction treatment and also rendered semiconductive by performing the semiconductivity induction heat treatment.

FIG. 24 provides cross-sectional views illustrating structures of the coupling lines 213 electrically connecting a data signal line S and a scanning signal line G; more specifically, FIG. 24(A) is a cross-sectional view illustrating a structure of the coupling line 213 in which the scanning signal line G and the data signal line S are connected simply via the IGZO film 104c, and FIG. 24(B) is a cross-sectional view illustrating a structure of the coupling line 213 in which the scanning signal line G is connected to the data signal line via the IGZO film 104c and the connection line CL.

In the case of the coupling line 213 shown in FIG. 24(A), the scanning signal line G formed on the insulating substrate 101 is connected to the IGZO film 104c via a contact hole formed in the gate insulating film 103, and the data signal line S is connected directly to an end portion of a top surface of the IGZO film 104c. Thus, when the IGZO film 104c is conductive, the scanning signal line G and the data signal line S are electrically connected via the IGZO film 104c.

In FIG. 24(B), the scanning signal line G is connected to the IGZO film 104c by the connection line CL, which is formed simultaneously with the pixel electrode 109 so as to pass through a contact hole provided in the gate insulating film 103 and the passivation film 108 and a contact hole provided in the passivation film 108. The data signal line S is connected in the same manner as shown in FIG. 24(A). Thus, the scanning signal line G and the data signal line S are electrically connected via the IGZO film 104c and the connection line CL.

In this manner, in any of the coupling lines 213, the data signal line S and the scanning signal line G are not directly connected, and at least the IGZO film 104c is positioned therebetween, so that when the IGZO film 104c is a conductor, the data signal line S and the scanning signal line G are electrically connected via the IGZO film 104c. However, the coupling line 213 is not provided with any electrically conductive line that can take the place of the IGZO film 104c, and therefore, when the IGZO film 104c is a semiconductor, it is ensured that the data signal line S and the scanning signal line G are electrically insulated. Moreover, as can be appreciated from FIG. 24, the IGZO film 104c rendered conductive is positioned between silicon oxide films, which are formed in contact with top and bottom surfaces of the IGZO film 104c. Thus, the IGZO film 104c is rendered conductive by performing the conductivity induction treatment and also rendered semiconductive by performing the semiconductivity induction heat treatment.

<5.3 Effects>

The present embodiment achieves effects similar to those described in the preceding embodiments, although the TFTs 110, 230, and 240 are of a channel-etched type.

<6. TFTs with Oxide Semiconductor Channel Layers>

The oxide semiconductor that constitutes the channel layer of each of the TFTs 110, 220, and 230 may be an amorphous oxide semiconductor or a crystalline oxide semiconductor with a crystalline portion. Examples of the crystalline oxide semiconductor that can be used include a polycrystalline oxide semiconductor, a microcrystalline oxide semiconductor, and a crystalline oxide semiconductor in which the c-axis is oriented approximately vertical to the layer surface.

The channel layers of the TFTs 110, 220, and 230 may be film stacks of two or more layers. In this case, the channel layer may include a non-crystalline oxide semiconductor film and a crystalline oxide semiconductor film, a plurality of crystalline oxide semiconductor films with different crystal structures, or a plurality of non-crystalline oxide semiconductor films. In the case where the channel layer has a two-layer structure consisting of upper and lower layers, the top layer preferably includes an oxide semiconductor whose energy gap is higher than that of an oxide semiconductor included in the lower layer. However, in the case where the difference in energy gap between the two layers is relatively small, the lower-layer oxide semiconductor may have a higher energy gap than the upper-layer oxide semiconductor.

The materials, structures, and formation methods of the non-crystalline oxide semiconductor and the crystalline oxide semiconductor, along with the structures of the channel layers constituted by the film stacks, are described in, for example, Japanese Laid-Open Patent Publication No. 2014-7399. The content of Japanese Laid-Open Patent Publication No. 2014-7399 is incorporated by reference herein in its entirety.

The oxide semiconductor film may contain, for example, at least one of the following metallic elements: In, Ga, and Zn. The oxide semiconductor film includes, for example, an In—Ga—Zn—O based semiconductor (e.g., indium-gallium-zinc oxide). The In—Ga—Zn—O based semiconductor is a ternary oxide composed of In (indium), Ga (gallium), and Zn (zinc). Examples of the ratio (composition ratio) of In, Ga, and Zn include but are not specifically limited to In:Ga:Zn=2:2:1, In:Ga:Zn=1:1:1, and In:Ga:Zn=1:1:2. The channel layer is formed using an oxide semiconductor film containing an In—Ga—Zn—O based semiconductor.

The In—Ga—Zn—O based semiconductor may be amorphous or crystalline. The crystalline In—Ga—Zn—O based semiconductor preferably has the c-axis oriented approximately vertical to the layer surface.

It should be noted that crystal structures of crystalline In—Ga—Zn—O based semiconductors are disclosed in, for example, Japanese Laid-Open Patent Publication No. 2014-7399 mentioned above and other publications such as Japanese Laid-Open Patent Publication Nos. 2012-134475 and 2014-209727. The content of each of Japanese Laid-Open Patent Publication Nos. 2012-134475 and 2014-209727 is incorporated by reference herein in its entirety. TFTs with In—Ga—Zn—O based channel layers offer high mobility (more than 20 times as high as amorphous silicon TFTs) and low leakage current (less than $\frac{1}{100}$ of that of amorphous silicon TFTs). Accordingly, such TFTs with In—Ga—Zn—O based channel layers are preferably used as TFTs provided in the pixel forming portions 100 included in the display portion and also as TFTs included in the scanning signal line driver circuit 30 and the data signal line driver circuit 40 provided around the display portion on the same substrate as the display portion.

Therefore, although the channel layer 104 of the TFT 110 has been described in the embodiments as being made of an In—Ga—Zn—O based semiconductor, another oxide semiconductor may be contained instead of the In—Ga—Zn—O based semiconductor. The channel layer 104 may contain, for example, an In—Sn—Zn—O based semiconductor (e.g., $In_2O_3$—$SnO_2$—ZnO or InSnZnO). The In—Sn—Zn—O based semiconductor is a ternary oxide composed of In (indium), Sn (tin), and Zn (zinc). Moreover, the channel layer may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, or the like. Here, Al, Ti, Cd, Ge, Pb, Mg, Zr, and Hf represent aluminum, titanium, cadmium, germanium, lead, magnesium, zirconium, and hafnium, respectively. Note that the temperature at which the IGZO film is changed from a conductor to a semiconductor has been described in the embodiments as being from 200° C. to 350° C., but the temperature varies depending on the type of oxide semiconductor.

The embodiments have been described with respect to the case where the coupling lines 211 to 213 are TFTs with channel layers made of an oxide semiconductor film. However, the TFTs in the pixel forming portions 100, the TFTs 230 and 240 in the panel inspection circuit, and the TFTs included in peripheral circuits such as the scanning signal line driver circuit 30 and the data signal line driver circuit 40 may be structured to include channel layers which are or include oxide semiconductor layers, or the TFTs may have channel layers made of amorphous silicon or polycrystalline silicon.

<7. Variant in Common Among the Embodiments>

The coupling lines 211 to 213 of the coupling conductor line 220 in the embodiments may be modified such that gate electrodes are additionally formed in the coupling line 211 (see FIG. 9(B)) and the coupling line 212 (see FIG. 10) described in the first embodiment. FIG. 25 provides cross-sectional views illustrating such coupling lines 211 and 212 including gate electrodes; more specifically, FIG. 25(A) is a cross-sectional view illustrating a structure of the coupling line 211 in which the gate electrode is disposed above the IGZO film 104c connecting adjacent scanning signal lines $G_1$ and $G_2$, and FIG. 25(B) is a cross-sectional view illustrating a structure of the coupling line 212 in which the gate electrode 275 is disposed below the IGZO film 104c connecting adjacent scanning signal lines $G_1$ and $G_2$.

The coupling line 211 shown in FIG. 25(A) additionally includes the gate electrode 274 formed simultaneously with the data signal lines so as to be disposed in a position corresponding to the IGZO film 104c in the coupling line 211 shown in FIG. 9(B). The coupling line 212 shown in FIG. 25(B) additionally includes the gate electrode 275 formed simultaneously with the scanning signal lines so as to be disposed on the insulating substrate 101 in a position corresponding to the IGZO film 104c in the coupling line 212 shown in FIG. 10. The gate electrodes 274 and 275 are not connected to any lines, so that the gate electrodes 274 and 275 are in floating state and do not function as gate electrodes. Accordingly, the coupling lines 211 and 212 do not function as transistors and are essentially the same as the coupling line 211 shown in FIG. 9(B) and the coupling line 212 shown in FIG. 10, respectively.

<8. Application to Other Display Devices>

The embodiments have been described taking the liquid crystal display device as an example. However, the display device to which the present invention can be applied is not limited to the liquid crystal display device, and the invention can also be applied to organic EL (electroluminescent) and micro-electro-mechanical display devices including active-matrix substrates in which each pixel forming portion is provided with a TFT.

This application claims priority to Japanese Patent Application No. 2016-70802, filed Mar. 31, 2016 and titled "ACTIVE MATRIX SUBSTRATE, MANUFACTURING METHOD THEREFOR AND DISPLAY DEVICE", the content of which is incorporated by reference herein in its entirety.

DESCRIPTION OF THE REFERENCE CHARACTERS 10 liquid crystal display device
20 liquid crystal panel
25 display portion
30 scanning signal line driver circuit
40 data signal line driver circuit
100 pixel forming portion
101 insulating substrate
102 gate electrode
103 gate insulating film
104 channel layer
104c IGZO film
105a etch-stop layer
106 source electrode
107 drain electrode
108 passivation film
109 pixel electrode
110 TFT (thin-film transistor)
211 to 213 coupling line
220 coupling conductor line
230 TFT (first thin-film transistor)
231 to 234 line (first line)
240 TFT (second thin-film transistor)
241 to 245 line (second line)
250 electrostatic discharge prevention circuit
260 panel inspection circuit
G1 to G4 scanning signal line
S1 to S5 data signal line

The invention claimed is:

1. An active-matrix substrate with a plurality of pixel forming portions formed in a matrix on an insulating substrate, comprising:
    a display portion including a plurality of scanning signal lines formed on the insulating substrate, a plurality of data signal lines formed on a gate insulating film so as to cross each of the scanning signal lines, the gate insulating film being formed on the scanning signal lines, and the pixel forming portions being formed corresponding to respective intersections of the scanning signal lines and the data signal lines;
    a scanning signal line driver circuit configured to sequentially select the scanning signal lines;
    a data signal line driver circuit configured to write image signal voltages to the data signal lines, the image signal voltages being generated on the basis of externally inputted image data;
    a coupling conductor line provided outside the display portion and coupling either the scanning signal lines or the data signal lines, or both; and
    a display portion inspection circuit configured to inspect whether there is any short circuit between the scanning signal lines, between the data signal lines, and between the scanning signal lines and the data signal lines, the display portion inspection circuit being disposed outside the display portion, wherein,
    the coupling conductor line couples the signal lines by coupling lines disposed between each respective adjacent pair of the signal lines and including oxide semiconductor films;
    the display portion inspection circuit includes:
        a first inspection control portion including a plurality of first lines respectively connected to the scanning signal lines and a plurality of first thin-film transistors respectively connected to the first lines and controlling voltages applied to the scanning signal lines, the first inspection control portion connecting the first lines together or separately for each of two or more groups; and
        a second inspection control portion including a plurality of second lines respectively connected to the data signal lines and a plurality of second thin-film transistors respectively connected to the second lines and controlling voltages applied to the data signal lines, the second inspection control portion connecting the second lines together or separately for each of two or more groups; and
    the first and second thin-film transistors have channel layers made of an oxide semiconductor.

2. The active-matrix substrate according to claim 1, wherein at least some of the coupling lines that connect each respective adjacent pair of the signal lines are connected simply by the oxide semiconductor films.

3. The active-matrix substrate according to claim 2, wherein the oxide semiconductor films included in the coupling lines that connect each respective adjacent pair of the signal lines are semiconductive.

4. The active-matrix substrate according to claim 1, wherein the coupling conductor line includes a first coupling conductor line and a second coupling conductor line, the first coupling conductor line couples the scanning signal lines by first coupling lines disposed between each respective adjacent pair of the scanning signal lines and including the oxide semiconductor films, and the second coupling conductor line couples the data signal lines by second coupling lines disposed between each respective adjacent pair of the data signal lines and including the oxide semiconductor films.

5. The active-matrix substrate according to claim 1, wherein the coupling conductor line couples the scanning signal lines and the data signal lines by disposing the coupling lines including the oxide semiconductor films between each respective adjacent pair of the scanning signal lines, between each respective adjacent pair of the data signal lines, and between an adjacent pair of the data signal line and the scanning signal line.

6. The active-matrix substrate according to claim 1, wherein the pixel forming portion includes a thin-film transistor with a channel layer made of an oxide semiconductor, and the thin-film transistor is of a channel-stop type.

7. A display device using an active-matrix substrate of claim 1 as a display panel for displaying an image.

8. A method for manufacturing an active-matrix substrate of claim 1, comprising the steps of:
   forming a gate insulating film so as to cover a gate electrode formed on the insulating substrate;
   forming the oxide semiconductor film on the gate insulating film;
   performing a conductivity induction treatment for rendering the oxide semiconductor film conductive;
   covering the oxide semiconductor film with an oxide film; and
   performing a semiconductivity induction heat treatment for changing the oxide semiconductor film from a conductor to a semiconductor, wherein,
   the semiconductivity induction heat treatment is a heat treatment performed during procedures from forming a protective film for protecting the pixel forming portion to forming an orientation film for aligning an orientation direction of liquid crystal molecules.

9. The method according to claim 8, wherein the semiconductivity induction heat treatment is a heat treatment performed after the protective film for protecting the pixel forming portion is formed.

10. The method according to claim 8, wherein,
    the active-matrix substrate further includes a pixel electrode formed on the protective film of the pixel forming portion, and
    the semiconductivity induction heat treatment is a heat treatment for crystalizing a transparent metal that constitutes the pixel electrode when the pixel electrode is formed.

11. The method according to claim 8, wherein the semiconductivity induction heat treatment is a heat treatment performed after a resin is applied to the pixel forming portion as the orientation film.

12. The method according to claim 8, wherein,
    the active-matrix substrate further includes a display portion inspection circuit configured to inspect whether there is any short circuit between the signal lines formed in the display portion, and
    the display portion inspection circuit inspects whether there is any short circuit between the signal lines without requiring the coupling conductor lines to be severed from the active-matrix substrate after the semiconductivity induction heat treatment.

13. The active-matrix substrate according to claim 1, wherein the pixel forming portion includes a thin-film transistor with a channel layer made of an oxide semiconductor, and the thin-film transistor is of a channel-etched type.

14. The active-matrix substrate according to claim 13, wherein the coupling lines that couple each respective adjacent pair of the scanning signal lines are structured such that the oxide semiconductor film and the respective adjacent pair of the scanning signal lines are connected by a connection line formed simultaneously with the data signal lines.

15. The active-matrix substrate according to claim 13, wherein the coupling lines that couple each respective adjacent pair of the data signal lines are structured such that the respective adjacent pair of the data signal lines are directly connected to the oxide semiconductor film.

16. The active-matrix substrate according to claim 13, wherein the coupling line that couples the adjacent pair of the scanning signal line and the data signal line is structured such that the data signal line and the scanning signal line are directly connected to the oxide semiconductor film.

17. The active-matrix substrate according to claim 13, wherein the coupling line that couples the adjacent pair of the scanning signal line and the data signal line is structured such that one of the data signal line and the scanning signal line is directly connected to the oxide semiconductor film, and the other is connected to the oxide semiconductor film via a connection line formed simultaneously with pixel electrodes provided in the pixel forming portions.

18. The active-matrix substrate according to claim 17, wherein all of the data signal line, the scanning signal line, and the oxide semiconductor film do not simultaneously overlap one another.

19. An active-matrix substrate with a plurality of pixel forming portions formed in a matrix on an insulating substrate, comprising:
    a display portion including a plurality of scanning signal lines formed on the insulating substrate, a plurality of data signal lines formed on a gate insulating film so as to cross each of the scanning signal lines, the gate insulating film being formed on the scanning signal lines, and the pixel forming portions being formed corresponding to respective intersections of the scanning signal lines and the data signal lines;
    a scanning signal line driver circuit configured to sequentially select the scanning signal lines;
    a data signal line driver circuit configured to write image signal voltages to the data signal lines, the image signal voltages being generated on the basis of externally inputted image data; and
    a coupling conductor line provided outside the display portion and coupling either the scanning signal lines or the data signal lines, or both, wherein
    the coupling conductor line couples the signal lines by coupling lines disposed between each respective adjacent pair of the signal lines and including, oxide semiconductor films;
    the pixel forming, portion includes a thin-film transistor with a channel layer made of an oxide semiconductor, and the thin-film transistor is of a channel-etched type; and
    the coupling lines that couple each respective adjacent pair of the scanning signal lines are structured such that the respective adjacent pair of the scanning signal lines are directly connected by the oxide semiconductor film.

* * * * *